US012573341B2

(12) United States Patent
Liu et al.

(10) Patent No.: US 12,573,341 B2
(45) Date of Patent: Mar. 10, 2026

(54) PIXEL CIRCUIT AND DRIVING METHOD THEREOF, AND DISPLAY PANEL

(71) Applicants: Chengdu BOE Optoelectronics Technology Co., Ltd., Chengdu (CN); BOE Technology Group Co., Ltd., Beijing (CN)

(72) Inventors: Cong Liu, Beijing (CN); Benlian Wang, Beijing (CN); Yao Huang, Beijing (CN); Weiyun Huang, Beijing (CN); Binyan Wang, Beijing (CN)

(73) Assignees: Chengdu BOE Optoelectronics Technology Co., Ltd., Chengdu (CN); BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 18/270,094

(22) PCT Filed: Jul. 15, 2022

(86) PCT No.: PCT/CN2022/106018
§ 371 (c)(1),
(2) Date: Jun. 28, 2023

(87) PCT Pub. No.: WO2023/005694
PCT Pub. Date: Feb. 2, 2023

(65) Prior Publication Data
US 2024/0062721 A1 Feb. 22, 2024

(30) Foreign Application Priority Data

Jul. 30, 2021 (WO) ................ PCT/CN2021/109890
Aug. 5, 2021 (CN) .......................... 202110898683.7

(51) Int. Cl.
*G09G 3/3233* (2016.01)
*G09G 3/3225* (2016.01)
(Continued)

(52) U.S. Cl.
CPC ......... *G09G 3/3233* (2013.01); *G09G 3/3225* (2013.01); *G09G 3/3266* (2013.01);
(Continued)

(58) Field of Classification Search
CPC .. G09G 3/3233; G09G 3/3225; G09G 3/3266; G09G 3/3275; G09G 3/3291;
(Continued)

(56) References Cited

U.S. PATENT DOCUMENTS 10,381,426 B2    8/2019   Ka et al.
10,388,239 B2    8/2019   Lin et al.
(Continued)

FOREIGN PATENT DOCUMENTS

CN        102467876 A        5/2012
CN        103778889 A        5/2014
(Continued)

OTHER PUBLICATIONS

Aug. 3, 2022 (CN) First Office Action Appn 202110897272.6 with English Translation.
(Continued)

*Primary Examiner* — Amit Chatly
(74) *Attorney, Agent, or Firm* — Banner & Witcoff, Ltd.

(57) ABSTRACT

A pixel circuit and a driving method thereof, and a display panel. The pixel circuit includes a driving circuit, a data writing circuit, a compensation control circuit, an energy storage circuit, a first light-emitting control circuit, a second light-emitting control circuit, a first initialization circuit, a second initialization circuit, and a transmission circuit. The driving circuit includes a control terminal, a first terminal and a second terminal, and is configured to control a driving current flowing through the first terminal and the second terminal and used for driving a light-emitting element to emit light. The first initialization circuit is configured to
(Continued)

apply a first initialization voltage to the control terminal of the driving circuit; the second initialization circuit is configured to apply a second initialization voltage to the first electrode of the light-emitting element.

17 Claims, 10 Drawing Sheets

(51) Int. Cl.

| | |
|---|---|
| *G09G 3/3266* | (2016.01) |
| *G09G 3/3275* | (2016.01) |
| *G09G 3/3291* | (2016.01) |
| *H10K 59/121* | (2023.01) |
| *H10K 59/126* | (2023.01) |

(52) U.S. Cl.
CPC ......... *G09G 3/3275* (2013.01); *G09G 3/3291* (2013.01); *H10K 59/1213* (2023.02); *G09G 2300/0426* (2013.01); *G09G 2300/0452* (2013.01); *G09G 2300/0819* (2013.01); *G09G 2300/0842* (2013.01); *G09G 2300/0852* (2013.01); *G09G 2300/0861* (2013.01); *G09G 2310/0251* (2013.01); *G09G 2310/061* (2013.01); *G09G 2310/08* (2013.01); *G09G 2320/0233* (2013.01); *G09G 2320/0247* (2013.01); *G09G 2320/045* (2013.01); *G09G 2330/021* (2013.01); *H10K 59/1216* (2023.02); *H10K 59/126* (2023.02)

(58) Field of Classification Search
CPC ... G09G 2300/0426; G09G 2300/0452; G09G 2300/0819; G09G 2300/0842; G09G 2300/0852; G09G 2300/0861; G09G 2310/0251; G09G 2310/061; G09G 2310/08; G09G 2320/0233; G09G 2320/0247; G09G 2320/045; G09G 2330/021; G09G 3/3208; G09G 2310/0264; H10K 59/1213; H10K 59/1216; H10K 59/126
See application file for complete search history.

(56) References Cited

U.S. PATENT DOCUMENTS

| | | | |
|---|---|---|---|
| 10,431,153 B2 | 10/2019 | Gao et al. |
| 10,529,283 B2 | 1/2020 | Chai et al. |
| 10,720,102 B2 | 7/2020 | Umeda et al. |
| 10,916,198 B2 | 2/2021 | Lin et al. |
| 10,984,725 B1 | 4/2021 | He et al. |
| 11,049,458 B1 | 6/2021 | Fan et al. |
| 11,068,092 B2 | 7/2021 | Han et al. |
| 11,222,587 B2 | 1/2022 | Toyomura |
| 11,263,960 B2 | 3/2022 | Xiong et al. |
| 11,282,461 B2 | 3/2022 | Li et al. |
| 11,373,582 B2 | 6/2022 | Lee et al. |
| 11,386,838 B2 | 7/2022 | Gao |
| 11,393,396 B2 | 7/2022 | Yang et al. |
| 2008/0150846 A1 | 6/2008 | Chung |
| 2009/0289558 A1 | 11/2009 | Oku |
| 2009/0289876 A1 | 11/2009 | Chun |
| 2012/0105410 A1 | 5/2012 | Choi et al. |
| 2012/0147060 A1 | 6/2012 | Jeong |
| 2015/0077412 A1 | 3/2015 | Nakamura |
| 2015/0154906 A1 | 6/2015 | Chung |
| 2017/0124941 A1 | 5/2017 | Na et al. |
| 2017/0193901 A1 | 7/2017 | Wang et al. |
| 2018/0047337 A1 | 2/2018 | Zhu et al. |
| 2018/0301092 A1 | 10/2018 | Ma |
| 2019/0057646 A1 | 2/2019 | Lin et al. |
| 2019/0058029 A1 | 2/2019 | Woo et al. |

| | | | |
|---|---|---|---|
| 2020/0160788 A1 | 5/2020 | Son |
| 2020/0184893 A1 | 6/2020 | Dong |
| 2020/0286972 A1 | 9/2020 | Seo et al. |
| 2020/0312223 A1 | 10/2020 | Yuan et al. |
| 2020/0388229 A1 | 12/2020 | Zhang et al. |
| 2020/0394961 A1* | 12/2020 | Kim ..................... G09G 3/3233 |
| 2021/0027696 A1 | 1/2021 | Kim et al. |
| 2021/0043138 A1* | 2/2021 | Lin ..................... G09G 3/3225 |
| 2021/0118361 A1 | 4/2021 | Li |
| 2021/0125557 A1 | 4/2021 | Na |
| 2021/0174736 A1 | 6/2021 | Yang et al. |
| 2021/0193049 A1 | 6/2021 | Lin et al. |
| 2021/0225282 A1 | 7/2021 | Cho et al. |
| 2021/0280130 A1 | 9/2021 | Wang et al. |
| 2021/0287605 A1 | 9/2021 | Wang et al. |
| 2021/0366397 A1 | 11/2021 | Na |
| 2021/0375193 A1 | 12/2021 | Son et al. |
| 2021/0383752 A1 | 12/2021 | Yang |
| 2021/0407383 A1 | 12/2021 | Lai et al. |
| 2022/0005414 A1 | 1/2022 | Liu et al. |
| 2022/0130322 A1 | 4/2022 | Yuan et al. |
| 2022/0139968 A1 | 5/2022 | Li et al. |
| 2022/0157238 A1 | 5/2022 | Wang et al. |
| 2022/0165213 A1 | 5/2022 | Huang et al. |
| 2022/0165984 A1 | 5/2022 | Choi et al. |
| 2022/0208932 A1 | 6/2022 | Yun |
| 2022/0270552 A1 | 8/2022 | Roh et al. |
| 2022/0310017 A1 | 9/2022 | Yang |
| 2022/0343852 A1 | 10/2022 | Wang et al. |
| 2022/0376024 A1 | 11/2022 | Zheng et al. |
| 2023/0360600 A1* | 11/2023 | Wang ................... G09G 3/3266 |
| 2024/0013727 A1* | 1/2024 | Zhang ..................... G09G 3/20 |

FOREIGN PATENT DOCUMENTS

| | | |
|---|---|---|
| CN | 102568374 B | 9/2015 |
| CN | 105427803 A | 3/2016 |
| CN | 105427806 A | 3/2016 |
| CN | 205920745 U | 2/2017 |
| CN | 106910468 A | 6/2017 |
| CN | 107146577 A | 9/2017 |
| CN | 107256695 A | 10/2017 |
| CN | 107274830 A | 10/2017 |
| CN | 107358918 A | 11/2017 |
| CN | 107564468 A | 1/2018 |
| CN | 107610651 A | 1/2018 |
| CN | 108133687 A | 6/2018 |
| CN | 108206008 A | 6/2018 |
| CN | 109215582 A | 1/2019 |
| CN | 109215585 A | 1/2019 |
| CN | 109285500 A | 1/2019 |
| CN | 109427293 A | 3/2019 |
| CN | 109509427 A | 3/2019 |
| CN | 109599062 A | 4/2019 |
| CN | 109817165 A | 5/2019 |
| CN | 110021273 A | 7/2019 |
| CN | 110033734 A | 7/2019 |
| CN | 110176213 A | 8/2019 |
| CN | 110648629 A | 1/2020 |
| CN | 110660360 A | 1/2020 |
| CN | 111158514 A | 5/2020 |
| CN | 111199711 A | 5/2020 |
| CN | 111354307 A | 6/2020 |
| CN | 111354314 A | 6/2020 |
| CN | 111435587 A | 7/2020 |
| CN | 111445854 A | 7/2020 |
| CN | 111489700 A | 8/2020 |
| CN | 111508426 A | 8/2020 |
| CN | 111583866 A | 8/2020 |
| CN | 111710299 A | 9/2020 |
| CN | 111724745 A | 9/2020 |
| CN | 111754922 A | 10/2020 |
| CN | 111754938 A | 10/2020 |
| CN | 111883055 A | 11/2020 |
| CN | 112053661 A | 12/2020 |
| CN | 112086062 A | 12/2020 |
| CN | 112116890 A | 12/2020 |
| CN | 112133253 A | 12/2020 |
| CN | 112309316 A | 2/2021 |

(56)         References Cited

FOREIGN PATENT DOCUMENTS

| | | | |
|---|---|---|---|
| CN | 112331678 A | 2/2021 |
| CN | 112382235 A | 2/2021 |
| CN | 112397026 A | 2/2021 |
| CN | 112397029 A | 2/2021 |
| CN | 112397030 A | 2/2021 |
| CN | 112397565 A | 2/2021 |
| CN | 112420794 A | 2/2021 |
| CN | 112435630 A | 3/2021 |
| CN | 112599099 A | 4/2021 |
| CN | 112712774 A | 4/2021 |
| CN | 112753065 A | 5/2021 |
| CN | 112767873 A | 5/2021 |
| CN | 112992071 A | 6/2021 |
| CN | 113097247 A | 7/2021 |
| CN | 113140179 A | 7/2021 |
| CN | 113224123 A | 8/2021 |
| CN | 113450717 A | 9/2021 |
| CN | 113838419 A | 12/2021 |
| CN | 114627807 A | 6/2022 |
| CN | 114694586 A | 7/2022 |
| JP | 2007011214 A | 1/2007 |
| JP | 2019128447 A | 8/2019 |
| JP | WO2019163402 A1 | 4/2021 |
| KR | 20090122119 A | 11/2009 |
| KR | 20130007214 A | 1/2013 |
| KR | 20170049778 A | 5/2017 |
| WO | 2019037543 A1 | 2/2019 |
| WO | 2020037767 A1 | 2/2020 |

OTHER PUBLICATIONS

Mar. 2, 20222 (CN) First Office Action Appn 202110898658.9 with English Translation.

Mar. 1, 2024—(US) Non-Final Office Action—U.S. Appl. No. 18/273,695.

Sep. 20, 2024—(US) Non-Final Office Action—U.S. Appl. No. 18/278,552.

Nov. 22, 2024 (CN) First Office Action Appn 202110898683.7 with English Translation.

Jun. 13, 2024—(US) Non-Final Office Action—U.S. Appl. No. 17/788,727.

Jun. 25, 2024—(US) Non-Final Office Action—U.S. Appl. No. 18/279,621.

Dec. 13, 2024 (CN) First Office Action Appn 202110897319.9 with English Translation.

* cited by examiner

PIXEL CIRCUIT AND DRIVING METHOD THEREOF, AND DISPLAY PANEL

CROSS-REFERENCE TO RELATED APPLICATION(S)

This application is a U.S. National Phase Entry of International Application PCT/CN2022/106018 filed Jul. 15, 2022, designating the United States of America and claiming priority to International Patent Application No. PCT/CN2021/109890 filed Jul. 30, 2021 and Chinese Patent Application No. 202110898683.7, filed Aug. 5, 2021. The present application claims priority to and the benefit of the above-identified applications and the above-identified applications are incorporated by reference herein in their entirety.

TECHNICAL FIELD

Embodiments of the present disclosure relate to a pixel circuit, a driving method thereof, and a display panel.

BACKGROUND

Organic Light-Emitting Diode (OLED) display panel possesses advantages such as small thickness, light weight, wide viewing angle, active luminescence, continuously adjustable luminous color, low cost, fast response speed, low energy consumption, low driving voltage, wide range of working temperature, simple production process, high luminous efficiency and capability of flexible display, etc., and hence is increasingly widely used in display fields such as mobile phones, tablet computers and digital cameras.

SUMMARY

At least one embodiment of the disclosure provides a pixel circuit, comprising: a driving circuit, a data writing circuit, a compensation control circuit, an energy storage circuit, a first light emission control circuit, a second light emission control circuit, a first initialization circuit, a second initialization circuit and a transmission circuit; wherein the driving circuit comprises a control terminal, a first terminal and a second terminal, and is configured to control a driving current flowing through the first terminal and the second terminal for driving a light-emitting element to emit light; the data writing circuit is configured to write a data signal into the first terminal of the driving circuit under a control of a first scanning signal; the compensation control circuit is configured to compensate for the driving circuit under a control of a second scanning signal; the energy storage circuit is configured to store a voltage of the control terminal of the driving circuit; the first light emission control circuit is configured to apply a first power supply voltage of a first power supply terminal to the first terminal of the driving circuit under a control of a first light emission control signal; the second light emission control circuit is configured to apply the driving current to a first electrode of the light-emitting element under a control of a second light emission control signal; the first initialization circuit is configured to apply a first initialization voltage to the control terminal of the driving circuit under a control of a first reset control signal; the transmission circuit is configured to transmit the first initialization voltage under a control of a transmission control signal; the second initialization circuit is configured to apply a second initialization voltage to the first electrode of the light-emitting element under a control of a second reset control signal; wherein the second light emission control circuit is further configured to transmit the second initialization voltage of the first electrode of the light-emitting element to the second terminal of the driving circuit under a control of the second light emission control signal, or, the first initialization circuit and the transmission circuit are jointly configured to apply the first initialization voltage to the control terminal of the driving circuit, and the compensation control circuit is further configured to transmit the first initialization voltage of the control terminal of the driving circuit to the second terminal of the driving circuit under a control of the second scanning signal, or, the first initialization circuit and the transmission circuit are jointly configured to apply the first initialization voltage to the second terminal of the driving circuit, and the compensation control circuit is further configured to transmit the first initialization voltage of the second terminal of the driving circuit to the control terminal of the driving circuit under a control of the second scanning signal.

For example, in the pixel circuit according to some embodiments of the disclosure, the driving circuit comprises a third transistor; a gate electrode of the third transistor serves as the control terminal of the driving circuit, a first electrode of the third transistor serves as the first terminal of the driving circuit, and a second electrode of the third transistor serves as the second terminal of the driving circuit.

For example, in the pixel circuit according to some embodiments of the disclosure, the data writing circuit comprises a fourth transistor; a gate electrode of the fourth transistor is connected to a first scanning signal terminal to receive the first scanning signal, a first electrode of the fourth transistor is connected to a data signal terminal to receive the data signal, and a second electrode of the fourth transistor is connected to the first terminal of the driving circuit.

For example, in the pixel circuit according to some embodiments of the disclosure, the compensation control circuit comprises a second transistor, and the energy storage circuit comprises a storage capacitor; a gate electrode of the second transistor is connected to a second scanning signal terminal to receive the second scanning signal, a first electrode of the second transistor is connected to the second terminal of the driving circuit, and a second electrode of the second transistor is connected to the control terminal of the driving circuit, a first electrode of the storage capacitor is coupled with the control terminal of the driving circuit, and a second electrode of the storage capacitor is coupled with the first power supply terminal.

For example, in the pixel circuit according to some embodiments of the disclosure, the second transistor is an N-type oxide thin film transistor, and the N-type oxide thin film transistor comprises a first metal layer, an active layer and a second metal layer which are sequentially stacked and insulated from each other, in an extension direction of the active layer, a width of the second metal layer is not greater than a width of the first metal layer; the second metal layer and the second scanning signal terminal are connected so as to serve as the gate electrode of the second transistor, or, both of the second metal layer and the first metal layer are connected to the second scanning signal terminal to serve as the gate electrode of the second transistor at the same time; the active layer comprises a channel region covered by the first metal layer, and a value of a width-length ratio of the channel region of the N-type oxide thin film transistor is in a range of [1/2, 7/8].

For example, in the pixel circuit according to some embodiments of the disclosure, the first light emission control circuit comprises a fifth transistor, a gate electrode of the fifth transistor is connected to a first light emission control signal terminal to receive the first light emission control signal, a first electrode of the fifth transistor is connected to the first power supply terminal to receive the first power supply voltage, and a second electrode of the fifth transistor is connected to the first terminal of the driving circuit.

For example, in the pixel circuit according to some embodiments of the disclosure, the second light emission control circuit comprises a sixth transistor, a gate electrode of the sixth transistor is connected to a second light emission control signal terminal to receive the second light emission control signal, a first electrode of the sixth transistor is connected to the second terminal of the driving circuit, and a second electrode of the sixth transistor is connected to the first electrode of the light-emitting element.

For example, in the pixel circuit according to some embodiments of the disclosure, the second initialization circuit comprises a seventh transistor, a gate electrode of the seventh transistor is connected to a second reset control signal terminal to receive the second reset control signal, a first electrode of the seventh transistor is connected to a second initialization voltage terminal to receive the second initialization voltage, and a second electrode of the seventh transistor is connected to the first electrode of the light-emitting element.

For example, in the pixel circuit according to some embodiments of the disclosure, the first initialization circuit comprises a first transistor, and the transmission circuit comprises an eighth transistor; a gate electrode of the first transistor is connected to a first reset control signal terminal to receive the first reset control signal, a first electrode of the first transistor is connected to a first initialization voltage terminal to receive the first initialization voltage, and a second electrode of the first transistor is connected to a first electrode of the eighth transistor; a gate electrode of the eighth transistor is connected to a transmission control signal terminal to receive the transmission control signal, and a second electrode of the eighth transistor is connected to the control terminal of the driving circuit.

For example, in the pixel circuit according to some embodiments of the disclosure, the second transistor and the seventh transistor both are N-type oxide thin film transistors; and the third transistor, the fourth transistor, the fifth transistor, the sixth transistor, the first transistor and the eighth transistor are all P-type thin film transistors; a value of a width-length ratio of a channel region of the first transistor is in a range of [1/3, 3/4], and a value of a width-length ratio of a channel region of the eighth transistor is in a range of [1/3, 3/4]; the second reset control signal and the first light emission control signal are a same control signal; and the transmission control signal and the second light emission control signal are a same control signal.

For example, in the pixel circuit according to some embodiments of the disclosure, the second transistor is an N-type oxide thin film transistor; and the third transistor, the fourth transistor, the fifth transistor, the sixth transistor, the seventh transistor, the first transistor and the eighth transistor are all P-type thin film transistors; a value of a width-length ratio of a channel region of the first transistor is in a range of [1/3, 3/4], and a value of a width-length ratio of a channel region of the eighth transistor is in a range of [1/3, 3/4]; the second reset control signal and the first reset control signal are a same control signal; and the transmission control signal is a same control signal as the first light emission control signal or the second light emission control signal.

For example, in the pixel circuit according to some embodiments of the disclosure, the first initialization circuit comprises a first transistor, and the transmission circuit comprises an eighth transistor.

A gate electrode of the first transistor is connected to a first reset control signal terminal to receive the first reset control signal, a first electrode of the first transistor is connected to the second electrode of the second transistor, and a second electrode of the first transistor is connected to the control terminal of the driving circuit; a gate electrode of the eighth transistor is connected to a transmission control signal terminal to receive the transmission control signal, a first electrode of the eighth transistor is connected to a first initialization voltage terminal to receive the first initialization voltage, and a second electrode of the eighth transistor is connected to the first electrode of the first transistor; the second electrode of the second transistor is connected to the control terminal of the driving circuit through the first transistor. For example, in the pixel circuit according to some embodiments of the disclosure, the second transistor and the seventh transistor both are N-type oxide thin film transistors; and the third transistor, the fourth transistor, the fifth transistor, the sixth transistor, the first transistor and the eighth transistor are all P-type thin film transistors; a value of a width-length ratio of a channel region of the first transistor is in a range of [1/3, 3/4], and a value of a width-length ratio of a channel region of the eighth transistor is in a range of [1/3, 3/4]; the second reset control signal and the first light emission control signal are a same control signal; and the transmission control signal and the second light emission control signal are a same control signal.

For example, in the pixel circuit according to some embodiments of the disclosure, the second transistor is an N-type oxide thin film transistor; and the third transistor, the fourth transistor, the fifth transistor, the sixth transistor, the seventh transistor, the first transistor and the eighth transistor are all P-type thin film transistors; a value of a width-length ratio of a channel region of the first transistor is in a range of [1/3, 3/4], and a value of a width-length ratio of a channel region of the eighth transistor is in a range of [1/3, 3/4]; the second reset control signal and the first reset control signal are a same control signal; and the transmission control signal and the second light emission control signal are a same control signal.

For example, in the pixel circuit according to some embodiments of the disclosure, the first initialization circuit comprises a first transistor, and the transmission circuit comprises an eighth transistor; a gate electrode of the first transistor is connected to a first reset control signal terminal to receive the first reset control signal, a first electrode of the first transistor is connected to a first initialization voltage terminal to receive the first initialization voltage, and a second electrode of the first transistor is connected to a first electrode of the eighth transistor; a gate electrode of the eighth transistor is connected to a transmission control signal terminal to receive the transmission control signal, and a second electrode of the eighth transistor is connected to the second terminal of the driving circuit.

For example, in the pixel circuit according to some embodiments of the disclosure, the second transistor and the seventh transistor both are N-type oxide thin film transistors; and the third transistor, the fourth transistor, the fifth transistor, the sixth transistor, the first transistor and the eighth transistor are all P-type thin film transistors; a value of a width-length ratio of a channel region of the first transistor is in a range of [1/3, 3/4], and a value of a width-length ratio of a channel region of the eighth transistor is in a range of

[1/3, 3/4]; the second reset control signal and the second light emission control signal are a same control signal; and the transmission control signal and the first light emission control signal are a same control signal.

For example, in the pixel circuit according to some embodiments of the disclosure, the second transistor is an N-type oxide thin film transistor; and the third transistor, the fourth transistor, the fifth transistor, the sixth transistor, the seventh transistor, the first transistor and the eighth transistor are all P-type thin film transistors; a value of a width-length ratio of a channel region of the first transistor is in a range of [1/3, 3/4], and a value of a width-length ratio of a channel region of the eighth transistor is in a range of [1/3, 3/4]; the second reset control signal and the first scanning signal are a same control signal; and the transmission control signal and the first light emission control signal are a same control signal.

At least some embodiments of the disclosure further provide a display panel, comprising a plurality of pixel units arranged in an array; wherein each of the plurality of pixel units comprises the pixel circuit according to any embodiment of the disclosure.

At least some embodiments of the disclosure further provide a driving method of the pixel circuit according to any embodiment of the disclosure, comprising a reset stage; wherein in the reset stage, inputting the second light emission control signal, the first reset control signal, the second reset control signal and the transmission control signal; turning on the second light emission control circuit, the first initialization circuit, the second initialization circuit and the transmission circuit; applying the first initialization voltage to the control terminal of the driving circuit through the first initialization circuit and the transmission circuit to reset the control terminal of the driving circuit; applying the second initialization voltage to the first electrode of the light-emitting element through the second initialization circuit to reset the light-emitting element; and applying the second initialization voltage to the second terminal of the driving circuit through the second initialization circuit and the second light emission control circuit to reset the second terminal of the driving circuit; or, inputting the second scanning signal, the first reset control signal, the second reset control signal and the transmission control signal; turning on the compensation control circuit, the first initialization circuit, the second initialization circuit and the transmission circuit; applying the first initialization voltage to the second terminal of the driving circuit through the first initialization circuit and the transmission circuit to reset the second terminal of the driving circuit; applying the first initialization voltage to the control terminal of the driving circuit through the first initialization circuit, the transmission circuit and the compensation control circuit to reset the control terminal of the driving circuit; and applying the second initialization voltage to the first electrode of the light-emitting element through the second initialization circuit to reset the light-emitting element; or, inputting the second scanning signal, the first reset control signal, the second reset control signal and the transmission control signal; turning on the compensation control circuit, the first initialization circuit, the second initialization circuit and the transmission circuit; applying the first initialization voltage to the control terminal of the driving circuit through the first initialization circuit and the transmission circuit to reset the control terminal of the driving circuit; applying the first initialization voltage to the second terminal of the driving circuit through the first initialization circuit, the transmission circuit and the compensation control circuit to reset the second terminal of the driving circuit; and applying the second initialization voltage to the first electrode of the light-emitting element through the second initialization circuit to reset the light-emitting element.

For example, the driving method provided by some embodiments of the disclosure further comprises a data writing and compensation stage, a holding stage and a light emission stage; wherein in the data writing and compensation stage, inputting the first scanning signal and the second scanning signal; turning on the data writing circuit, the driving circuit and the compensation control circuit; writing the data signal into the compensation control circuit through the data writing circuit; and compensating for the driving circuit through the compensation control circuit; in the holding stage, inputting the second scanning signal; turning off the compensation control circuit; and holding a voltage of the control terminal of the driving circuit through the energy storage circuit; in the light emission stage, inputting the first light emission control signal and the second light emission control signal; turning on the first light emission control circuit, the second light emission control circuit and the driving circuit; applying the first power supply voltage to the first terminal of the driving circuit through the first light emission control circuit, so that the driving circuit generates a driving current according to a voltage at the control terminal of the driving circuit; and applying the driving current to the light-emitting element through the second light emission control circuit, so that the light-emitting element emits light.

BRIEF DESCRIPTION OF DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

DETAILED DESCRIPTION

Figure 1A:
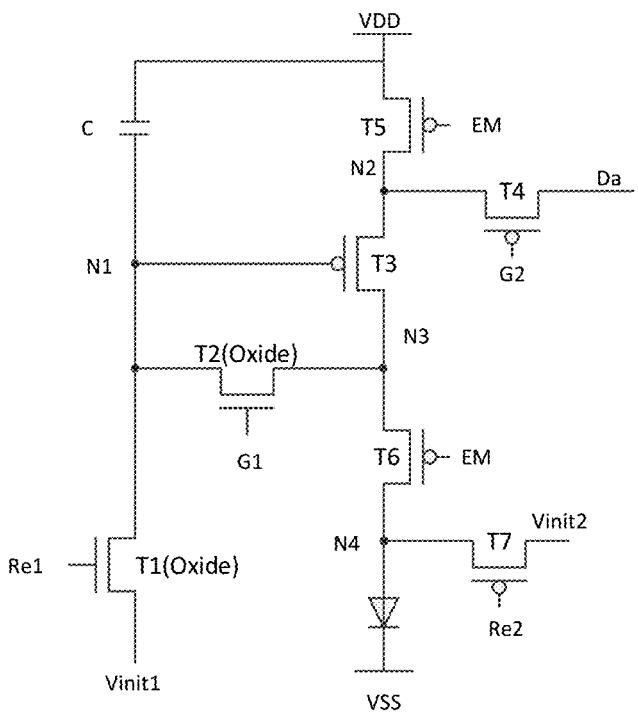
FIG. 1A is a schematic diagram of a 7T1C pixel circuit.

In order to make objects, technical details and advantages of the embodiments of the disclosure apparent, the technical solutions of the embodiment will be described in a clearly and fully understandable way in connection with the drawings related to the embodiments of the invention. It is obvious that the described embodiments are just a part but not all of the embodiments of the disclosure. Based on the described embodiments herein, those skilled in the art can obtain other embodiment(s), without any inventive work, which should be within the scope of the disclosure.

Unless otherwise specified, the technical terms or scientific terms used in the disclosure have normal meanings understood by those skilled in the art. The words "first", "second" and the like used in the disclosure do not indicate the sequence, the number or the importance but are only used for distinguishing different components. Likewise, "a", "an", "the" or similar words do not mean the limitation to amount, instead, it refers to at least one. The word "comprise", "include" or the like only indicates that an element or a component before the word contains elements or components listed after the word and equivalents thereof, not excluding other elements or components. The words "connection", "connected" and the like are not limited to physical or mechanical connection but may include electrical connection, either directly or indirectly. The words "on", "beneath", "left", "right" and the like only indicate the relative position relationship which is correspondingly changed when the absolute position of a described object is changed.

Hereinafter, the present disclosure will be described through several specific embodiments. In order to keep the following descriptions of the embodiments of the present disclosure clear and concise, detailed explanations of known functions and known components (elements) may be omitted. When any component (element) of an embodiment of the present disclosure appears in more than one figure, this component (element) is represented by the same or similar reference numeral in each figure. Generally, the matrix driving mode is adopted by pixel circuits in OLED display panels, and can be classified into Active Matrix (AM) driving mode and Passive Matrix (PM) driving mode depending on whether a switching component is introduced into each of the pixel units. For AMOLED, a group of thin film transistors and storage capacitor(s) are integrated in the pixel circuit (also referred to as "pixel driving circuit") of each pixel, and the current flowing through the OLED can be controlled through a driving control of the thin film transistors and the storage capacitor(s), so that the OLED can emit light as needed. Therefore, AMOLED requires for less driving current, involves lower power consumption and possesses longer service life, which can meet the requirements of large-size display with high resolution and multi-grayscale. At the same time, AMOLED has obvious advantages in terms of viewing angle, color reproduction, power consumption and response time, and is suitable for display devices with high information content and high resolution. The basic pixel circuit used in AMOLED display panels is usually a 2T1C pixel circuit, that is, two thin film transistors (TFTs) and one storage capacitor C are used to realize the basic function of driving the OLED to emit light. It should be noted that the pixel circuit actually used is not limited to the above-mentioned 2T1C pixel circuit, but also can be pixel circuits with other structures such as 4T1C, 4T2C, 6T1C or 7T1C.

FIG. 1A is a schematic diagram of a 7T1C pixel circuit. As shown in FIG. 1A, the 7T1C pixel circuit includes a driving transistor T3, a first transistor T1, a second transistor T2, a fourth transistor T4, a fifth transistor T5, a sixth transistor T6, a seventh transistor T7 and a capacitor C. A gate electrode of the driving transistor T3 is connected to a first node N1, a first electrode of the driving transistor T3 is connected to a second node N2, and a second electrode of the driving transistor T3 is connected to a third node N3; a first electrode of the fourth transistor T4 is connected to a data signal terminal Da, a second electrode of the fourth transistor T4 is connected to the second node N2, and a gate electrode of the fourth transistor T4 is connected to a gate driving signal terminal G2; a first electrode of the fifth transistor T5 is connected to a first power supply terminal VDD, a second electrode of the fifth transistor T5 is connected to the second node N2, and a gate electrode of the fifth transistor T5 is connected to an enabling signal terminal EM; a first electrode of the second transistor T2 is connected to the first node N1, a second electrode of the second transistor T2 is connected to a third node N3, and a gate electrode of the second transistor T2 is connected to a gate driving signal terminal G1; a first electrode of the sixth transistor T6 is connected to the third node N3, a second electrode of the sixth transistor T6 is connected to a fourth node N4, and a gate electrode of the sixth transistor T6 is connected to the enabling signal terminal EM; a first electrode of the seventh transistor T7 is connected to the fourth node N4, a second electrode of the seventh transistor T7 is connected to a second initialization signal terminal Vinit2, and a gate electrode of the seventh transistor T7 is connected to a second reset signal terminal Re2; a first electrode of the first transistor T1 is connected to the first node N1, a second electrode of the first transistor T1 is connected to a first initialization signal terminal Vinit1, a gate electrode of the first transistor T1 is connected to a first reset signal terminal Re1, and the capacitor C is connected between the first power supply terminal VDD and the first node N1. The pixel circuit may be connected to a light-emitting unit OLED for driving the light-emitting unit OLED to emit light, and the light-emitting unit OLED may be connected between the fourth node N4 and a second power supply terminal VSS. The first transistor T1 and the second transistor T2 may be N-type transistors, for example, the first transistor T1 and the second transistor T2 may be N-type metal oxide transistors, and the N-type metal oxide transistors have smaller leakage current so as to avoid a leakage current of the node N1 through the first transistor T1 and the second transistor T2 in a light emission stage. At the same time, the driving transistor T3, the fourth transistor T4, the fifth transistor T5, the sixth transistor T6, and the seventh transistor T7 can be P-type transistors, for example, the driving transistor T3, the fourth transistor T4, the fifth transistor T5, the sixth transistor T6 and the seventh transistor T7 can be P-type low-temperature polycrystalline silicon transistors, and the low-temperature polycrystalline silicon transistors have higher carrier mobility, which is beneficial to achieving a display panel with high resolution, high response speed, high pixels per inch and high aperture ratio. The first initialization signal terminal Vinit1 and the second initialization signal terminal Vinit2 can output the same voltage signal or different voltage signals depending on actual situations.

Figure 1B:
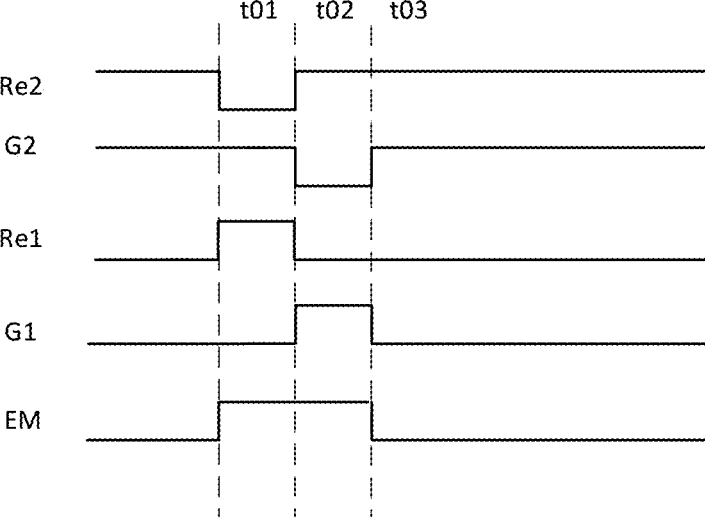
FIG. 1B is a signal timing diagram of a driving method of the 7T1C pixel circuit shown in FIG. 1A.

FIG. 1B is a signal timing diagram of a driving method of the 7T1C pixel circuit shown in FIG. 1A. G1 represents the timing of the gate driving signal terminal G1, G2 represents the timing of the gate driving signal terminal G2, Re1 represents the timing of the first reset signal terminal Re1, Re2 represents the timing of the second reset signal terminal Re2, and EM represents the timing of the enabling signal terminal EM. The driving method of the pixel circuit can include three stages, which are a reset stage t01, a data writing and compensation stage t02, and a light emission stage t03. In the reset stage t01, a high-level signal is input by the first reset signal terminal Re1, the first transistor T1 is turned on, and the first initialization signal terminal Vinit1 inputs a first initialization signal Vinit1 to the first node N1 to reset the first node N1 (i.e., the gate electrode of the driving transistor). In the data writing and compensation stage t2, a low-level signal is input by the gate driving signal terminal G2, a high-level signal is input by the gate driving signal terminal G1, and the fourth transistor T4 and the second transistor T2 are turned on; at the same time, a data signal Vdata is input by the data signal terminal Da to charge the first node N1 until a voltage of the first node N1 becomes Vdata+Vth, and the voltage Vdata+Vth of the first node N1 is stored by the storage capacitor C, where Vdata is a voltage of the data signal (i.e., a data voltage) and Vth is a threshold voltage of the driving transistor T3. In the light emission stage t03, the enabling signal terminal EM outputs a low-level signal, the sixth transistor T6 and the fifth transistor T5 are turned on, and the driving transistor T3 generates a driving current under the action of the voltage Vdata+Vth stored in the capacitor C; the driving current generated by the driving transistor can be obtained according to the following formula:

$$1 = 0.5\mu\, Cox * \left(\frac{w}{L}\right) * (V_{gs} - V_{th})^2$$
$$= 0.5\mu\, Cox * \left(\frac{W}{L}\right) * ((V_{data} + V_{th} - VDD) - V_{th})^2$$
$$= 0.5\mu\, Cox * \left(\frac{W}{L}\right) * (V_{data} - VDD)^2$$

where $\mu$ represents a carrier mobility, Cox represents a gate capacitance per unit area, W represents a width of a channel region of the driving transistor, L represents a length of the channel region of the driving transistor, Vgs represents a gate-source voltage difference of the driving transistor, Vth represents the threshold voltage of the driving transistor, and VDD represents a first power supply voltage provided by the first power supply terminal VDD. As can be seen from the above formula, the driving current $I_{LE}$ flowing through the light-emitting element OLED is no longer related to the threshold voltage Vth of the driving transistor T3, but only related to the data signal Vdata that controls a grayscale of the light emission of the pixel circuit. In this way, it can realize the compensation for the pixel circuit, solve the problem of threshold voltage drift of the driving transistor T3 due to manufacturing process as well as long-term operation and usage, and eliminate the influence of such drift on the driving current, thereby improving the display effect.

In the pixel circuit described above, a parasitic capacitance is present at each of the first node N1, the second node N2 and the third node N3. However, the above-mentioned driving method only resets the first node N1 without resetting the second node N2 and the third node N3 in the reset stage, which is not conducive to eliminating the influence of hysteresis and relieving the afterimage phenomenon. At least some embodiments of the present disclosure provide a pixel circuit.

The pixel circuit includes a driving circuit, a data writing circuit, a compensation control circuit, a first light emission control circuit, a second light emission control circuit, a first initialization circuit, a second initialization circuit and a transmission circuit. The driving circuit includes a control terminal, a first terminal and a second terminal, and is configured to control a driving current flowing through the first terminal and the second terminal for driving a light-emitting element to emit light; the data writing circuit is configured to write a data signal to the first terminal of the driving circuit under the control of a first scanning signal; the compensation control circuit is configured to compensate for the driving circuit under the control of a second scanning signal; the energy storage circuit is configured to store a voltage of the control terminal of the driving circuit; the first light emission control circuit is configured to apply a first power supply voltage to the first terminal of the driving circuit under the control of a first light emission control signal; the second light emission control circuit is configured to apply a driving current to a first electrode of the light-emitting element under the control of a second light emission control signal; the first initialization circuit is configured to apply a first initialization voltage to the control terminal of the driving circuit under the control of a first reset control signal; the transmission circuit is configured to transmit the first initialization voltage under the control of a transmission control signal; the second initialization circuit is configured to apply a second initialization voltage to the first electrode of the light-emitting element under the control of a second reset control signal. The second light emission control circuit is further configured to transmit the second initialization voltage of the first electrode of the light-emitting element to the second terminal of the driving circuit under the control of the second light emission control signal; alternatively, the first initialization circuit and the transmission circuit are jointly configured to apply the first initialization voltage to the control terminal of the driving circuit, and the compensation control circuit is further configured to transmit the first initialization voltage of the control terminal of the driving circuit to the second terminal of the driving circuit under the control of the second scanning signal; alternatively, the first initialization circuit and the transmission circuit are jointly configured to apply the first initialization voltage to the second terminal of the driving circuit, and the compensation control circuit is further configured to transmit the first initialization voltage of the second terminal of the driving circuit to the control terminal of the driving circuit under the control of the second scanning signal.

Some embodiments of the present disclosure further provide a driving method corresponding to the pixel circuit described above, and a display panel.

According to the pixel circuit, the driving method thereof and the display panel provided by the embodiments of the present disclosure, the control terminal and the second terminal of the driving circuit can be respectively reset every time when the pictures are switched, so that the control terminal and the second terminal of the driving circuit can be in the same bias state (relative to different pictures) every time when the pictures are displayed, thereby eliminating the influence of hysteresis, relieving the afterimage phenomenon, reducing the risk of screen flicker and improving the screen quality.

Figure 2:
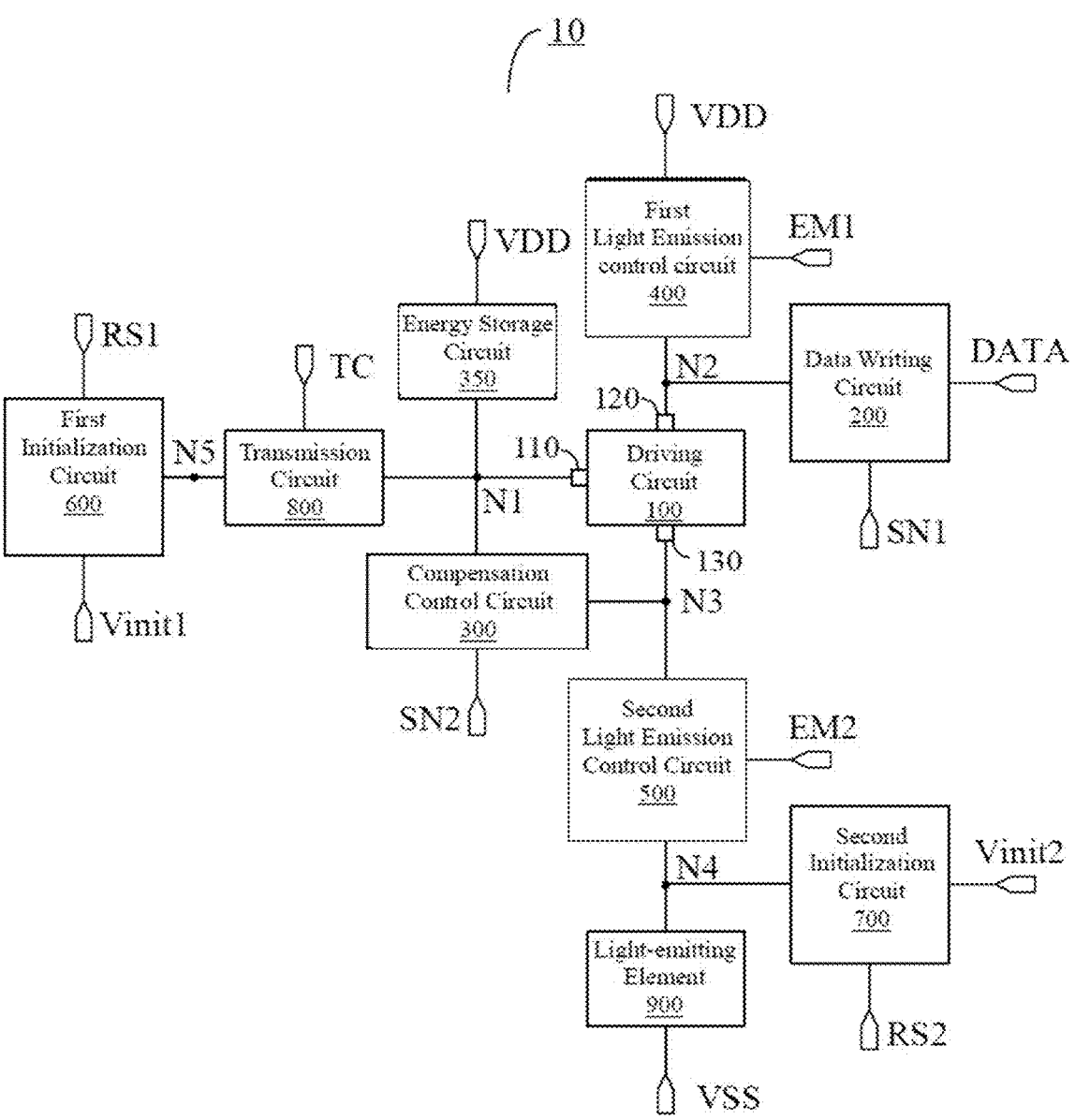
FIG. 2 is a schematic block diagram of a pixel circuit provided by at least some embodiments of the present disclosure.

Hereinafter, several embodiments of the present disclosure and examples thereof will be described in details with reference to the accompanying drawings. FIG. 2 is a schematic block diagram of a pixel circuit provided by at least some embodiments of the present disclosure. For example, a pixel circuit 10 can be used in a pixel unit of an AMOLED display panel. As shown in FIG. 2, the pixel circuit 10 includes a driving circuit 100, a data writing circuit 200, a compensation control circuit 300, an energy storage circuit 350, a first light emission control circuit 400, a second light emission control circuit 500, a first initialization circuit 600, a second initialization circuit 700 and a transmission circuit 800.

For example, the driving circuit 100 includes a control terminal 110, a first terminal 120 and a second terminal 130, and is configured to control a driving current flowing through the first terminal 120 and the second terminal 130 for driving a light-emitting element 900 to emit light. For example, as shown in FIG. 2, the control terminal 110 of the driving circuit 100 is connected to a first node N1, the first terminal 120 of the driving circuit 100 is connected to a second node N2, and the second terminal 130 of the driving circuit 100 is connected to a third node N3. For instance, in some examples, in a light emission stage, the driving circuit 100 can provide a driving current to the light-emitting element 900 to drive the light-emitting element 900 to emit light, and can provide corresponding driving current for light emission according to a grayscale to be displayed (different grayscales correspond to different data signals). For example, an organic light-emitting diode (OLED), a mini light-emitting diode (Mini LED), a micro light-emitting diode (Micro LED), a quantum dot light-emitting diode (QLED), an inorganic light-emitting diode or the like can be adopted as the light-emitting element 900. Embodiments of the present disclosure include these cases but are not limited thereto.

For example, the data writing circuit 200 is configured to write a data signal Vdata to the first terminal 120 of the driving circuit 100 under the control of a first scanning signal SN1. For example, as shown in FIG. 2, the data writing circuit 200 is connected to a first scanning signal terminal SN1 (for providing the first scanning signal), a data signal terminal DATA (for providing the data signal Vdata) and the second node N2. For instance, in some examples, in a data writing and compensation stage, the data writing circuit 200 is turned on in response to the first scanning signal SN1, so that the data signal Vdata provided by the data signal terminal DATA can be written into the first terminal 120 of the driving circuit 100.

For example, the compensation control circuit 300 is configured to compensate for the driving circuit 100 under the control of a second scanning signal SN2. For example, as shown in FIG. 2, the compensation control circuit 300 is connected to a second scanning signal terminal SN2 (for providing the second scanning signal), and the control terminal 110 (the first node N1) and the second terminal 130 (the third node N3) of the driving circuit 100. For instance, in some examples, in the data writing and compensation stage, the compensation control circuit 300 is turned on in response to the second scanning signal SN2, and electrically connects the control terminal 110 and the second terminal 130 of the driving circuit 100, so that information such as the data signal Vdata and a threshold voltage Vth of the driving circuit 100 can be written into the control terminal 110 of the driving circuit 100 and stored by the energy storage circuit 350, thereby realizing the compensation for threshold voltage of the driving circuit 100.

For example, the energy storage circuit 350 is configured to store a voltage of the control terminal 110 of the driving circuit 100. For example, as shown in FIG. 2, the energy storage circuit 350 is connected to the control terminal 110 (the first node N1) of the driving circuit 100 and a first power supply terminal VDD. For instance, in some examples, the energy storage circuit 350 includes a storage capacitor; the storage capacitor can store, in the data writing and compensation stage, a voltage including information such as the data signal Vdata and the threshold voltage Vth which is written into the control terminal 110 of the driving circuit 100 by the compensation circuit 300, and can further control, in the light emission stage, the driving circuit 100 by using the voltage including the information such as the data signal Vdata and the threshold voltage Vth as stored, so that the driving circuit 100 can generate a driving current for driving the light-emitting element 900 to emit light according to the data signal Vdata under compensation. For example, the first light emission control circuit 400 is configured to apply a first power supply voltage VDD to the first terminal 120 of the driving circuit 100 under the control of a first light emission control signal EM1. For example, as shown in FIG. 2, the first light emission control circuit 400 is connected to a first light emission control signal terminal EM1 (for providing the first light emission control signal), the first power supply terminal VDD (for providing the first power supply voltage) and the first terminal 120 (the second node N2) of the driving circuit 100. For instance, in some examples, in the light emission stage, the first light emission control circuit 400 is turned on in response to the first light emission control signal EM1, so that the first power supply voltage VDD can be applied to the first terminal 120 of the driving circuit 100; when the driving circuit 100 is turned on, it can apply the first power supply voltage VDD to the light-emitting element 900 to drive the light-emitting element to emit light. For example, the first power supply voltage VDD may be a driving voltage, such as a high voltage.

For example, the second light emission control circuit 500 is configured to apply a driving current to a first electrode of the light-emitting element 900 under the control of a second light emission control signal EM2. For example, as shown in FIG. 2, the second light emission control circuit 500 is connected to a second light emission control signal terminal EM2 (for providing the second light emission control signal), the third node N3 and a fourth node N4; the first electrode (e.g., an anode) of the light-emitting element 900 is connected to the fourth node N4; and a second electrode (e.g., a cathode) of the light-emitting element is connected to a second power supply voltage terminal VSS (for providing a second power supply voltage). For example, the second power supply voltage VSS is a low voltage (for example, a voltage lower than the first power supply voltage), such as a grounded voltage. For instance, in some examples, in the light emission stage, the second light emission control circuit 500 is turned on in response to the second light emission control signal EM2, so that a driving current can be applied to the light-emitting element 900 through the second light emission control circuit 500 by the driving circuit 100 to drive the light-emitting element to emit light.

For example, the first initialization circuit 600 is configured to apply a first initialization voltage Vinit1 to the control terminal 110 of the driving circuit 100 under the control of a first reset control signal RS1; and the transmission circuit 800 is configured to transmit the first initialization voltage Vinit1 under the control of a transmission control signal TC. For example, as shown in FIG. 2, the first initialization circuit 600 is connected to a first reset control terminal RS1 (for providing the first reset control signal), a first initialization voltage terminal Vinit1 (for providing the first initialization voltage) and a fifth node N5; and the transmission circuit 800 is connected to a transmission control signal terminal TC (for providing the transmission control signal), the fifth node N5 and the control terminal 110 (the first node N1) of the driving circuit 100. For instance, in some examples, in a reset stage, the first initialization circuit 600 is turned on in response to the first reset control signal RS1, and the transmission circuit 800 is turned on in response to the transmission control signal TC, so that the first initialization voltage Vinit1 can be applied to the first node N1 through the first initialization circuit 600 and the transmission circuit 800 to reset the control terminal 110 of the driving circuit 100, thereby eliminating the influence of a previous light emission stage on the control terminal 110 of the driving circuit 100.

For example, the second initialization circuit 700 is configured to apply a second initialization voltage Vinit2 to the first electrode of the light-emitting element 900 under the control of a second reset control signal RS2. For example, as shown in FIG. 2, the second initialization circuit 700 is connected to a second reset control signal terminal RS2 (for providing the second reset control signal), a second initialization voltage terminal Vinit2 (for providing the second initialization voltage) and the fourth node N4. For instance, in some examples, in the reset stage, the second initialization circuit 700 is turned on in response to the second reset control signal RS2, so that the second initialization voltage Vinit2 can be applied to the fourth node N4 to reset the first electrode of the light-emitting element 900 to eliminate the influence of the previous light emission stage on the first electrode of the light-emitting element 900.

For example, in some embodiments, in the pixel circuit 10 shown in FIG. 2, the second light emission control circuit 500 is further configured to transmit the second initialization voltage Vinit2 of the first electrode (the fourth node N4) of the light-emitting element 900 to the second terminal (the third node N3) of the light-emitting element 900 under the control of the second light emission control signal EM2. For instance, in some examples, in the reset stage, the second initialization circuit 700 is turned on in response to the second reset control signal RS2, so that the second initialization voltage Vinit2 can be applied to the fourth node n4; at the same time, the second light emission control circuit 500 is turned on in response to the second light emission control signal EM2, so that the second initialization voltage Vinit2 at the fourth node N4 can be transmitted to the third node N3, and the second terminal 130 of the driving circuit

100 can be reset to eliminate the influence of the previous light emission stage on the second terminal 130 of the driving circuit 100.

For example, in some other embodiments, in the pixel circuit 10 shown in FIG. 2, the first initialization circuit 600 and the transmission circuit 800 are jointly configured to apply the first initialization voltage Vinit1 to the control terminal 110 of the driving circuit 100, and the compensation control circuit 300 is further configured to transmit the first initialization voltage Vinit1 of the control terminal 110 (the first node N1) of the driving circuit 100 to the second terminal 130 (the third node N3) of the driving circuit 100 under the control of the second scanning signal SN2. For instance, in some examples, in the reset stage, the first initialization circuit 600 is turned on in response to the first reset control signal RS1, and the transmission circuit 800 is turned on in response to the transmission control signal TC, so that the first initialization voltage Vinit1 can be applied to the first node N1 through the first initialization circuit 600 and the transmission circuit 800; at the same time, the compensation control circuit 300 is turned on in response to the second scanning signal SN2, so that the first initialization voltage Vinit1 at the first node N1 can be transmitted to the third node N3, and the second terminal 130 of the driving circuit 100 can be reset to eliminate the influence of the previous light emission stage on the second terminal 130 of the driving circuit 100. For instance, in some examples, in the reset stage, the first initialization circuit 600 is turned on in response to the first reset control signal RS1, and the transmission circuit 800 is turned on in response to the transmission control signal TC, so that the first initialization voltage Vinit1 can be applied to the first node N1 through the first initialization circuit 600 and the transmission circuit 800; at the same time, the compensation control circuit 300 is turned on in response to the second scanning signal SN2, the first light emission control circuit 400 is turned on in response to the first light emission control signal EM1, and the driving circuit 100 is turned on under the control of the first initialization voltage Vinit1 at the first node N1, so that a conducted path is formed between the first power supply terminal VDD and the first initialization voltage terminal Vinit1 via the first light emission control circuit 400, the driving circuit 100, the compensation control circuit 300, the transmission circuit 800 and the first initialization circuit 600, and the second node N2 and the third node N3 can also be reset while resetting the first node N1, thereby eliminating the influence of hysteresis to the greatest extent.

It should be noted that, in the embodiments of the present disclosure, if feasible, some of the aforementioned control signals (including the first scanning signal SN1, the second scanning signal SN2, the first light emission control signal EM1, the second light emission control signal EM2, the first reset control signal RS1, the second reset control signal RS2 and the transmission control signal TC) may be the same signal, for example, the same signal may be transmitted by the same signal line or by different signal lines. For example, when some of these control signals are transmitted by the same signal line, the layout space of the display panel can be saved, which is beneficial to the development of high-resolution display panels.

In addition, in the embodiments of the present disclosure, when the pixel circuits 10 of a plurality of pixel units in the display panel are arranged in an array, part of the control signals can be reused for pixel units in different rows, for example, thereby simplifying the layout space around the display panel and facilitating the development of high-resolution display panels. For example, for one row of pixel units, the first light emission control signal EM1 used to control the first light emission control circuit 400 in the pixel circuit 10 of the pixel unit of the current row can also be used to control the second light emission control circuit 500 in the pixel circuit 10 of the pixel unit of a previous row, that is, reused as the second light emission control signal EM2 in the pixel circuit 10 of the pixel unit of the previous row; similarly, the second light emission control signal EM2 used to control the second light emission control circuit 500 in the pixel circuit 10 of the pixel unit of the current row can also be used to control the first light emission control circuit 400 in the pixel circuit 10 of the pixel unit of a next row, that is, reused as the first light emission control signal EM1 in the pixel circuit 10 of the pixel unit of the next row. It should be noted that the embodiments of the present disclosure include such case but are not limited thereto.

It should be understood that a signal pulse of the first light emission control signal EM1 and a signal pulse of the second light emission control signal EM2 may differ by one or two time units, wherein one time unit is, for example, a scanning time of one row of sub-pixels. That is to say, there is a mismatch between the timing of the first light emission control signal EM1 and the timing of the second light emission control signal EM2, which also applies to the following embodiments and will not be described in detail.

It should be noted that in the description of the embodiments of the present disclosure, the first node N1, the second node N2, the third node N3, the fourth node N4, and a fifth node N5 (to be described later) do not represent actual components, but represent intersection points of related circuit connections in the circuit diagram. It should be noted that in the description of the embodiments of the present disclosure, symbols VDD, VSS, Vinit1 and Vinit2 can represent both of corresponding voltage terminals and corresponding voltages; symbols SN1, SN2, EM1, EM2, RS1, RS2 and TC can represent both of corresponding control signal terminals and corresponding control signals, which also applies to the following embodiments and will not be described in detail.

Figure 3:
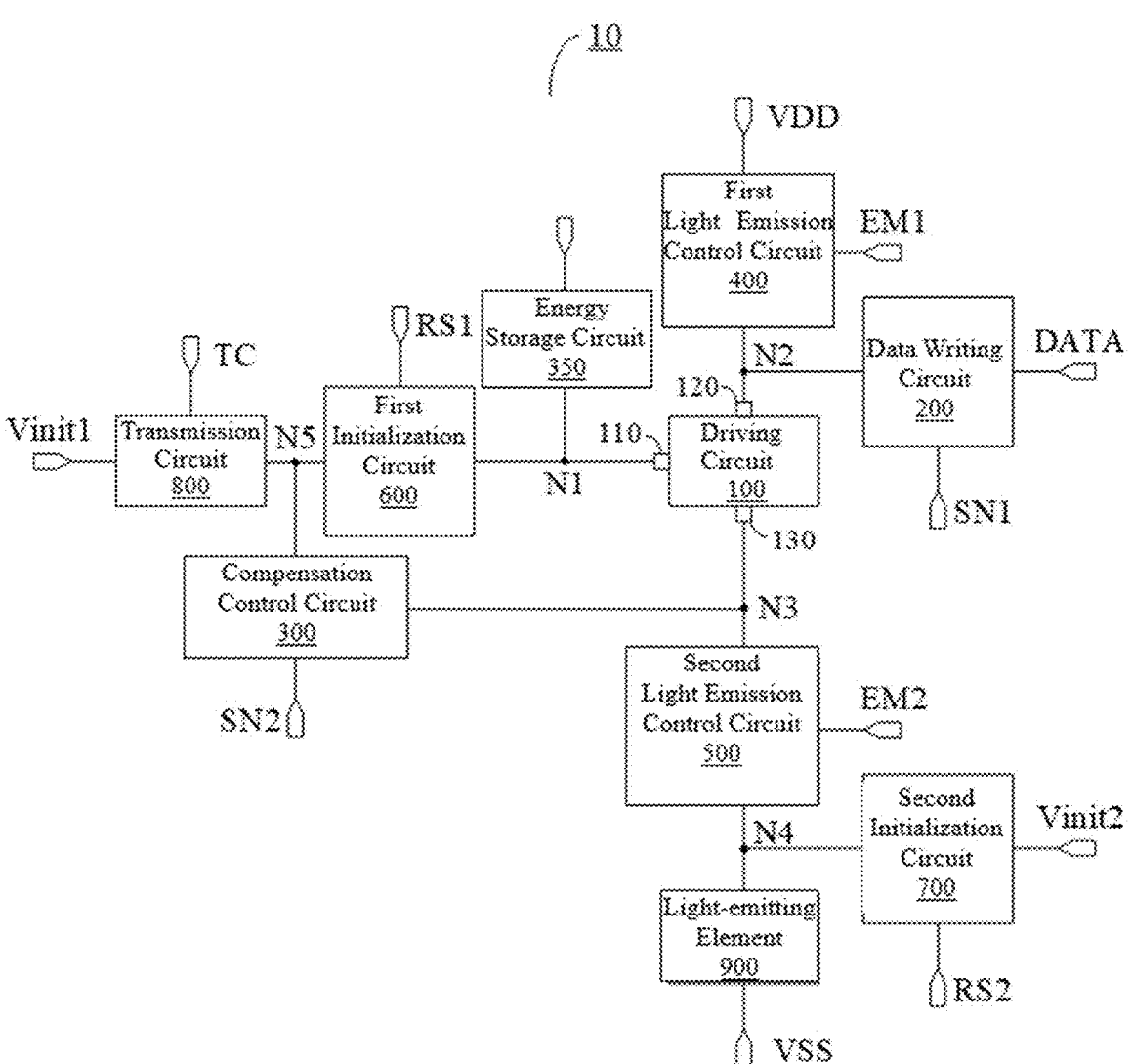
FIG. 3 is a schematic block diagram of another pixel circuit provided by at least some embodiments of the present disclosure.

FIG. 3 is a schematic block diagram of another pixel circuit provided by at least some embodiments of the present disclosure. The pixel circuit 10 shown in FIG. 3 is different from the pixel circuit 10 shown in FIG. 2 mainly in the connection modes of the compensation control circuit 300, the first initialization circuit 600 and the transmission circuit 800. It should be noted that other circuit structures in the pixel circuit 10 shown in FIG. 3 are basically the same as those in the pixel circuit 10 shown in FIG. 2, and the repetition will not be repeated here. It should be understood that the basic functions of each circuit structure in the pixel circuit 10 shown in FIG. 3 are basically the same as those of the corresponding circuit structure in the pixel circuit 10 shown in FIG. 2, and the repetition will not be repeated here.

For example, as shown in FIG. 3, the compensation control circuit 300 is connected to the second scanning signal terminal SN2, the second terminal 130 (the third node N3) of the driving circuit 100, a fifth node N5 and the first power supply terminal VDD; the first initialization circuit 600 is connected to the first reset control terminal RS1, the control terminal 110 (the first node N1) of the driving circuit 100 and the fifth node N5; and the transmission circuit 800 is connected to the transmission control signal terminal TC, the fifth node N5 and the first initiation voltage terminal Vinit1. For instance, in some examples, in the reset stage, the first initialization circuit 600 is turned on in response to the first reset control signal RS1, and the transmission circuit 800 is turned on in response to the transmission control signal TC, so that the first initialization voltage Vinit1 can be applied to the first node N1 through the transmission circuit 800 and the first initialization circuit 600 to reset the control terminal 110 of the driving circuit 100, thereby eliminating the influence of the previous light emission stage on the control terminal 110 of the driving circuit 100. For instance, in some examples, in the data writing and compensation stage, the first initialization circuit 600 is turned on in response to the first reset control signal RS1, and the compensation control circuit 300 is turned on in response to the second scanning signal SN2, and the control terminal 110 and the second terminal 130 of the driving circuit 100 are electrically connected through the first initialization circuit 600 and the compensation control circuit 300, so that information related to the data signal Vdata and the threshold voltage Vth of the driving circuit 100 written by the data writing circuit 500 is correspondingly stored in the energy storage circuit 350. For example, in some embodiments, in the pixel circuit 10 shown in FIG. 3, the second light emission control circuit 500 is further configured to transmit the second initialization voltage Vinit2 of the first electrode (the fourth node N4) of the light-emitting element 900 to the second terminal (the third node N3) of the driving circuit 900 under the control of the second light emission control signal EM2. For instance, in some examples, in the reset stage, the second initialization circuit 700 is turned on in response to the second reset control signal RS2, so that the second initialization voltage Vinit2 can be applied to the fourth node N4; at the same time, the second light emission control circuit 500 is turned on in response to the second light emission control signal EM2, so that the second initialization voltage Vinit2 at the fourth node N4 can be transmitted to the third node N3, and the second terminal 130 of the driving circuit 100 can be reset, thereby eliminating the influence of the previous light emission stage on the second terminal 130 of the driving circuit 100.

Figure 4:
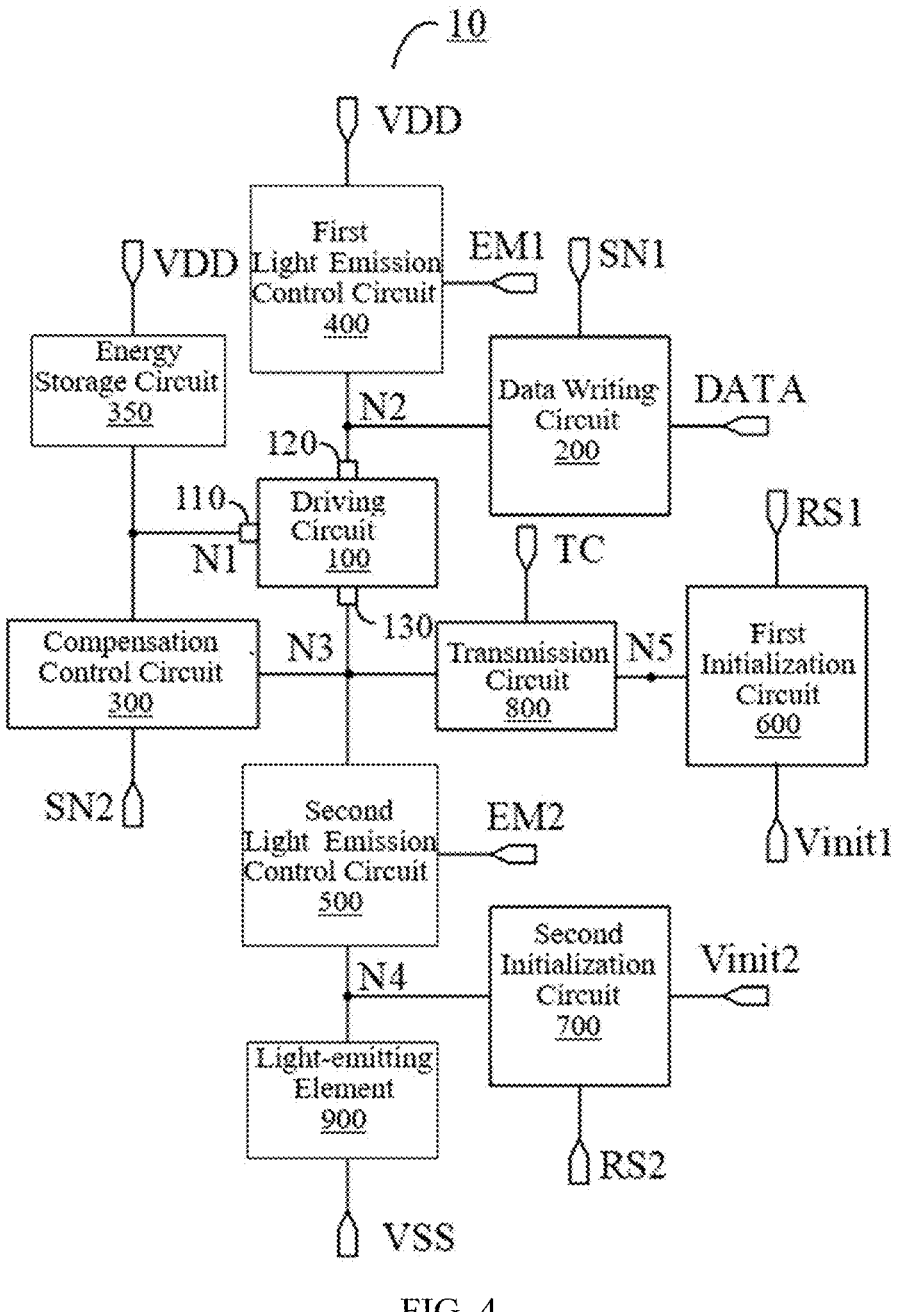
FIG. 4 is a schematic block diagram of yet another pixel circuit provided by at least some embodiments of the present disclosure.

FIG. 4 is a schematic block diagram of yet another pixel circuit provided by at least some embodiments of the present disclosure. The pixel circuit 10 shown in FIG. 4 is different from the pixel circuit 10 shown in FIG. 2 mainly in the connection modes of the first initialization circuit 600 and the transmission circuit 800. It should be noted that other circuit structures in the pixel circuit 10 shown in FIG. 4 are basically the same as those in the pixel circuit 10 shown in FIG. 2, and the repetition will not be repeated here. It should be understood that the basic functions of each circuit structure in the pixel circuit 10 shown in FIG. 4 are basically the same as that of the corresponding circuit structure in the pixel circuit 10 shown in FIG. 2, and the repetition will not be repeated here.

For example, in the pixel circuit 10 shown in FIG. 4, the first initialization circuit 600 and the transmission circuit 800 are jointly configured to apply the first initialization voltage Vinit1 to the second terminal 130 (the third node N3) of the driving circuit 100, and the compensation control circuit 300 is further configured to transmit the first initialization voltage Vinit1 of the second terminal 130 of the driving circuit 100 to the control terminal 110 of the driving circuit 100 under the control of the second scanning signal SN2. For example, as shown in FIG. 4, the first initialization circuit 600 is connected to the first reset control terminal RS1, the first initialization voltage terminal Vinit1 and the fifth node N5; and the transmission circuit 800 is connected to the transmission control signal terminal TC, the fifth node N5 and the second terminal 130 (the third node N3) of the driving circuit 100. For instance, in some examples, in the reset stage, the first initialization circuit 600 is turned on in response to the first reset control signal RS1, and the
transmission circuit 800 is turned on in response to the
transmission control signal TC, so that the first initialization
voltage Vinit1 can be applied to the third node N3 through
the first initialization circuit 600 and the transmission circuit
800 to reset the second terminal 130 of the driving circuit
100, thereby eliminating the influence of the previous light
emission stage on the second terminal 130 of the driving
circuit 100; at the same time, the compensation control
circuit 300 is turned on in response to the second scanning
signal SN2, so that the first initialization voltage Vinit1 at the
third node N3 can be transmitted to the first node N1, and the
control terminal 110 of the driving circuit 100 can be reset,
thereby eliminating the influence of the previous light emis-
sion stage on the control terminal 110 of the driving circuit
100. For instance, in some other examples, in addition to the
operation process of the circuit structures described in the
above examples, in the reset stage, the first light emission
control circuit 400 is turned on in response to the first light
emission control signal EM1, and the driving circuit 100 is
turned on under the control of the first initialization voltage
Vinit1 at the first node N1, so that a conducted path is
formed between the first power supply terminal VDD and
the first initialization voltage terminal Vinit1 via the first
light emission control circuit 400, the driving circuit 100, the
compensation control circuit 300, the transmission circuit
800 and the first initialization circuit 600, and the second
node N2 can also be reset while resetting the first node N1
and the third node N3, thereby eliminating the influence of
hysteresis to the greatest extent.

Figure 5:
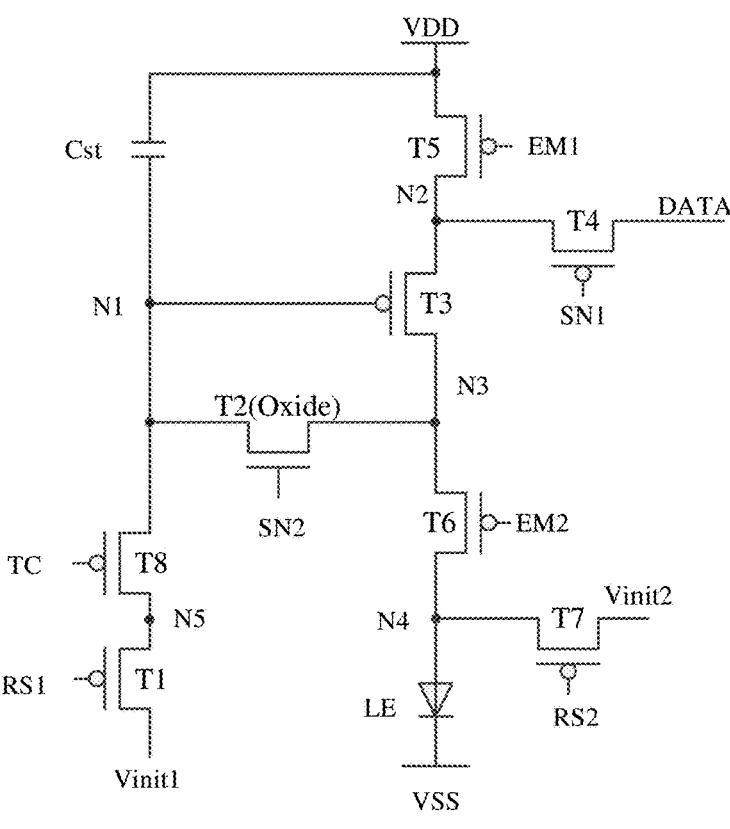
FIG. 5 is a schematic circuit structure diagram of a specific implementation example of the pixel circuit shown in FIG. 2.

FIG. 5 is a schematic circuit structure diagram of a
specific implementation example of the pixel circuit shown
in FIG. 2. As shown in FIG. 5, the pixel circuit 10 includes
first to eighth transistors T1-T8 and a storage capacitor Cst,
and the light-emitting element LE shown in FIG. 5 is the
aforementioned light-emitting element 900. For example,
the third transistor T3 is used as a driving transistor, and
other transistors are used as switching transistors. For
example, OLED can be adopted as the light-emitting ele-
ment LE, and the embodiments of the present disclosure
include such case but are not limited thereto. The following
embodiments are all described with reference to the case of
OLED by way of example, and will not be repeated here.
OLED can be of various types, such as top emission type,
bottom emission type, etc., and can emit red light, green
light, blue light or white light, etc., which is not limited by
the embodiments of the present disclosure.

For example, as shown in FIG. 5, the driving circuit 100
may be implemented as the third transistor T3. A gate
electrode of the third transistor T3 is used as the control
terminal 110 of the driving circuit 100 and is connected to
the first node N1; a first electrode of the third transistor T3
is used as the first terminal 120 of the driving circuit 100 and
is connected to the second node N2; and a second electrode
of the third transistor T3 is used as the second terminal 130
of the driving circuit 100 and is connected to the third node
N3. For example, as shown in FIG. 5, the third transistor T3
may be a P-type thin film transistor; for example, the P-type
thin film transistor can include a low-temperature polysili-
con transistor, which has high carrier mobility and is ben-
eficial to realizing a display panel with high resolution, high
response speed, high pixels per inch and high aperture ratio.
For example, the P-type thin film transistor is turned on in
response to a low level of a control signal thereof. This also
applies to the following embodiments, and the details will
not be repeated here. For example, the threshold voltage Vth
of the third transistor T3 may be greater than or equal to −5V and less than or equal to −2 v; the threshold voltage Vth of
the third transistor T3 may be greater than or equal to −4V
and less than or equal to −2.5 v; for example, the threshold
voltage Vth of the third transistor T3 may be −4V, −3.5V,
−3V or −2.5V, without limited thereto.

For example, as shown in FIG. 5, the data writing circuit
200 may be implemented as the fourth transistor T4. A gate
electrode of the fourth transistor T4 is connected to the first
scanning signal terminal SN1 to receive the first scanning
signal; a first electrode of the fourth transistor T4 is con-
nected to the data signal terminal DATA to receive the data
signal Vdata; and a second electrode of the fourth transistor
T4 is connected to the first terminal of the driving circuit.
For example, as shown in FIG. 5, the fourth transistor T4
may be a P-type thin film transistor, for example, a thin film
transistor having an active layer of low-temperature doped
polysilicon.

For example, as shown in FIG. 5, the compensation
control circuit 300 may be implemented as the second
transistor T2, and the energy storage circuit 350 may be
implemented as the storage capacitor Cst. A gate electrode
of the second transistor T2 is connected to the second
scanning signal terminal SN2 to receive the second scanning
signal; a first electrode of the second transistor T2 is
connected to the second terminal 130 (the third node N3) of
the driving circuit 100; and a second electrode of the second
transistor T2 is connected to the control terminal 110 (the
first node N1) of the driving circuit 100; a first electrode of
the storage capacitor Cst is coupled with the control terminal
110 (the first node N1) of the driving circuit 100, and a
second electrode of the storage capacitor Cst is coupled with
the first power supply terminal VDD. For example, as shown
in FIG. 5, the second transistor T2 may be an N-type thin
film transistor. For example, the second transistor T2 can be
an N-type oxide thin film transistor, and Indium Gallium
Zinc Oxide (IGZO) can be adopted as the active layer of the
thin film transistor; compared with the case of using Low
Temperature Poly Silicon (LTPS) or amorphous silicon (e.g.,
hydrogenated amorphous silicon) as the active layer of the
thin film transistor, it can effectively reduce the size of the
transistor and reduce the leakage current. For example, the
N-type thin film transistor is turned on in response to a high
level of a control signal thereof, which also applies to the
following embodiments and will not be described in detail.

For example, as shown in FIG. 5, the first light emission
control circuit 400 may be implemented as the fifth transis-
tor T5. A gate electrode of the fifth transistor T5 is connected
to the first light emission control signal terminal EM1 to
receive the first light emission control signal, a first electrode
of the fifth transistor T5 is connected to the first power
supply terminal VDD to receive the first power supply
voltage, and a second electrode of the fifth transistor T5 is
connected to the first terminal 120 (the second node N2) of
the driving circuit 100. For example, as shown in FIG. 5, the
fifth transistor T5 may be a P-type thin film transistor, for
example, a thin film transistor having an active layer of
low-temperature doped polysilicon. For example, the first
power supply voltage VDD may be a driving voltage, such
as a high voltage. For example, a voltage value of the first
power supply voltage VDD may be 4.6V, without limited
thereto.

For example, as shown in FIG. 5, the second light
emission control circuit 500 may be implemented as the
sixth transistor T6. A gate electrode of the sixth transistor T6
is connected to the second light emission control signal
terminal EM2 to receive the second light emission control
signal, a first electrode of the sixth transistor T6 is connected to the second terminal 130 (the third node N3) of the driving circuit 100, and a second electrode of the sixth transistor T6 is connected to the fourth node N4. For example, as shown in FIG. 5, the sixth transistor T6 may be a P-type thin film transistor, for example, a thin film transistor having an active layer of low-temperature doped polysilicon.

For example, as shown in FIG. 5, the second initialization circuit 700 may be implemented as the seventh transistor T7. A gate electrode of the seventh transistor T7 is connected to the second reset control signal terminal RS2 to receive the second reset control signal, a first electrode of the seventh transistor T7 is connected to the second initialization voltage terminal Vinit2 to receive the second initialization voltage, and a second electrode of the seventh transistor T7 is connected to the fourth node N4. For example, as shown in FIG. 5, the seventh transistor T7 may be a P-type thin film transistor, for example, a thin film transistor having an active layer of low-temperature doped polysilicon. For example, the second initialization voltage Vinit2 may be a DC voltage, and a voltage value of the second initialization voltage Vinit2 may be greater than or equal to −7V and less than or equal to 0V; for example, the voltage value of the second initialization voltage Vinit2 may be −6V, −5V, −4V, −3V or −2V, without limited thereto.

For example, as shown in FIG. 5, the first initialization circuit 600 may be implemented as the first transistor T1. A gate electrode of the first transistor T1 is connected to the first reset control signal terminal RS1 to receive the first reset control signal, a first electrode of the first transistor T1 is connected to the first initialization voltage terminal Vinit1 to receive the first initialization voltage, and a second electrode of the first transistor T1 is connected to the fifth node N5. For example, as shown in FIG. 5, the first transistor T1 may be a P-type thin film transistor, for example, a thin film transistor having an active layer of low-temperature doped polysilicon. For example, the first initialization voltage Vinit1 may be a DC voltage, and a voltage value of the first initialization voltage Vinit1 may be greater than or equal to −7V and less than or equal to 0V; for example, the voltage value of the first initialization voltage Vinit1 may be −6V, −5V, −4V, −3V or −2V, without limited thereto.

For example, as shown in FIG. 5, the transmission circuit 800 may be implemented as the eighth transistor T8. A gate electrode of the eighth transistor T8 is connected to the transmission control signal terminal TC to receive the transmission control signal, a first electrode of the eighth transistor T8 is connected to the fifth node N5, and a second electrode of the eighth transistor T8 is connected to the control terminal 110 (the first node N1) of the driving circuit 100. For example, as shown in FIG. 5, the eighth transistor T8 may be a P-type thin film transistor, such as a thin film transistor having an active layer of low-temperature doped polysilicon.

For example, as shown in FIG. 5, a first electrode (e.g., an anode) of the light-emitting element LE is connected to the fourth node N4, and a second electrode (e.g., a cathode) of the light-emitting element LE is connected to the second power supply terminal VSS to receive the second power supply voltage. For example, the second power supply voltage VSS may be a low voltage, and for example, the second power supply terminal ELVSS may be grounded, so that the second power supply voltage VSS may be a grounded voltage (zero voltage).

For example, for the pixel circuit shown in FIG. 5, the second reset control signal RS2 may be the same control signal as the first reset control signal RS1; the transmission control signal TC may be the same control signal as the first light emission control signal EM1 or the second light emission control signal EM2. It should be noted that the embodiments of the present disclosure make no limitation thereto.

Figure 6:
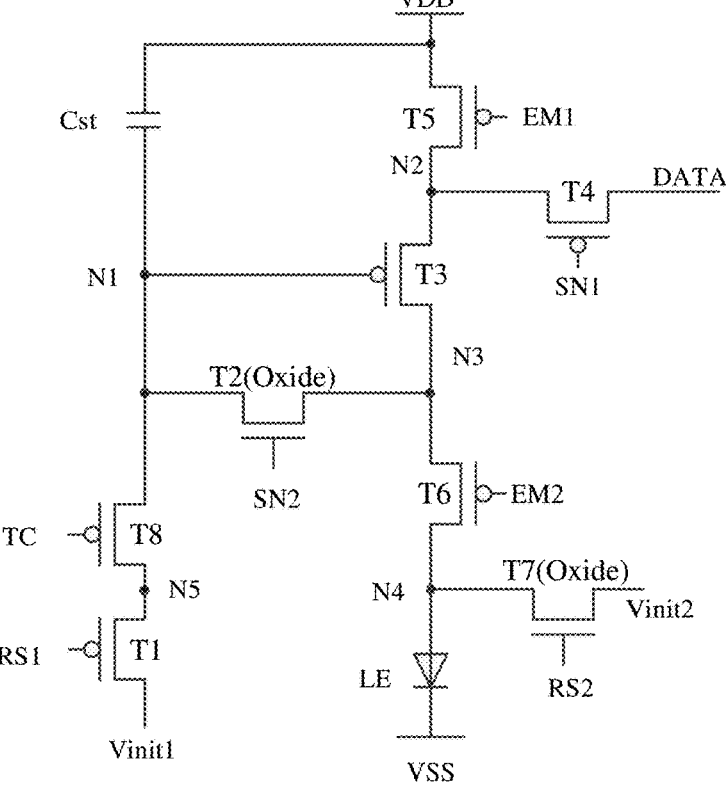
FIG. 6 is a schematic circuit structure diagram of another specific implementation example of the pixel circuit shown in FIG. 2.

FIG. 6 is a schematic circuit structure diagram of another specific implementation example of the pixel circuit shown in FIG. 2. The difference between the pixel circuit shown in FIG. 6 and the pixel circuit shown in FIG. 5 lies in that, in the pixel circuit shown in FIG. 6, the seventh transistor T7 is an N-type thin film transistor, such as an N-type oxide thin film transistor, which is beneficial to reducing the size of the transistor and the leakage current of the fourth node N4. It should be noted that other circuit structures in the pixel circuit shown in FIG. 6 are basically the same as those in the pixel circuit shown in FIG. 5, and the repetition will be not be repeated here.

For example, for the pixel circuit shown in FIG. 6, the second reset control signal RS2 may be the same control signal as the first light emission control signal EM1; and the transmission control signal TC may be the same control signal as the second light emission control signal EM2. It should be noted that the embodiments of the present disclosure make no limitation thereto.

Figure 7:
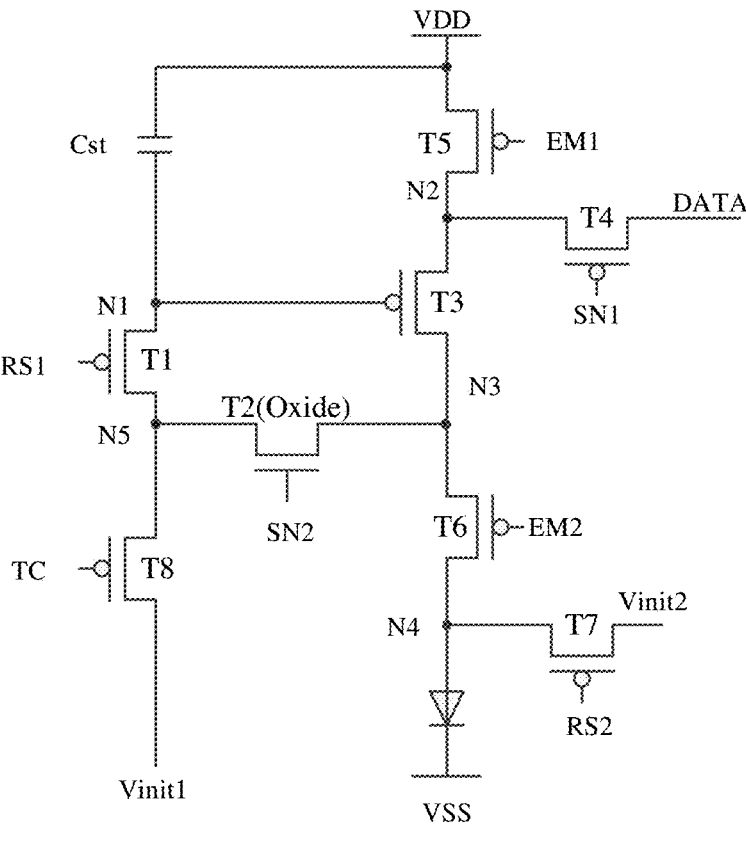
FIG. 7 is a schematic circuit structure diagram of a specific implementation example of the pixel circuit shown in FIG. 3.

FIG. 7 is a schematic circuit structure diagram of a specific implementation example of the pixel circuit shown in FIG. 3. The pixel circuit 10 shown in FIG. 7 is different from the pixel circuit shown in FIG. 5 mainly in the connection modes of the second transistor T2, the first transistor T1 and the eighth transistor T8. It should be noted that other circuit structures in the pixel circuit shown in FIG. 7 are basically the same as those in the pixel circuit shown in FIG. 5, and the repetition will not be repeated here.

For example, as shown in FIG. 7, the gate electrode of the first transistor T1 is connected to the first reset control signal terminal RS1 to receive the first reset control signal, the first electrode of the first transistor T1 is connected to the fifth node N5, and the second electrode of the first transistor T1 is connected to the control terminal 110 (the first node N1) of the driving circuit 100; the gate electrode of the eighth transistor T8 is connected to the transmission control signal terminal TC to receive the transmission control signal, the first electrode of the eighth transistor T8 is connected to the first initialization voltage terminal Vinit1 to receive the first initialization voltage, and the second electrode of the eighth transistor is connected to the fifth node N5; the gate electrode of the second transistor T2 is connected to the second scanning signal terminal SN2 to receive the second scanning signal, the first electrode of the second transistor T2 is connected to the second terminal 130 (the third node N3) of the driving circuit 100, and the second electrode of the second transistor T2 is connected to the fifth node N5. That is to say, the second electrode of the second transistor T2 is connected to the control terminal 110 of the driving circuit 100 through the first transistor T1.

For example, for the pixel circuit shown in FIG. 7, the second reset control signal RS2 may be the same control signal as the first reset control signal RS1; the transmission control signal TC may be the same control signal as the second light emission control signal EM2. It should be noted that the embodiments of the present disclosure make no limitation thereto.

Figure 8:
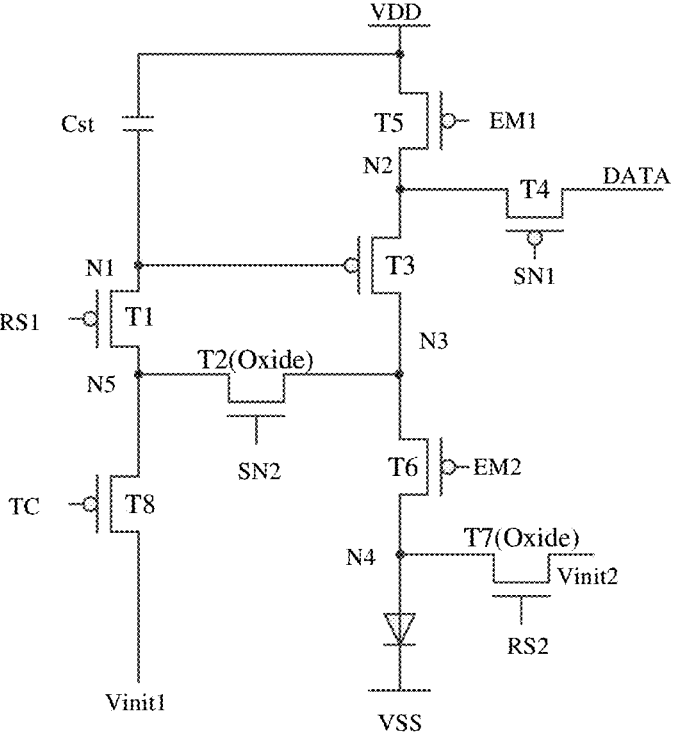
FIG. 8 is a schematic circuit structure diagram of another specific implementation example of the pixel circuit shown in FIG. 3.

FIG. 8 is a schematic circuit structure diagram of another specific implementation example of the pixel circuit shown in FIG. 3. The difference between the pixel circuit shown in FIG. 8 and the pixel circuit shown in FIG. 7 mainly lies in that, in the pixel circuit shown in FIG. 8, the seventh transistor T7 is an N-type thin film transistor, such as an N-type oxide thin film transistor, which is beneficial to reducing the size of the transistor and the leakage current of the fourth node N4. It should be noted that other circuit structures in the pixel circuit shown in FIG. 8 are basically the same as those in the pixel circuit shown in FIG. 7, and the repetition will not be repeated here.

For example, for the pixel circuit shown in FIG. 8, the second reset control signal RS2 may be the same control signal as the first light emission control signal EM1; the transmission control signal TC may be the same control signal as the second light emission control signal EM2. It should be noted that the embodiments of the present disclosure make no limitation thereto.

Figure 9:
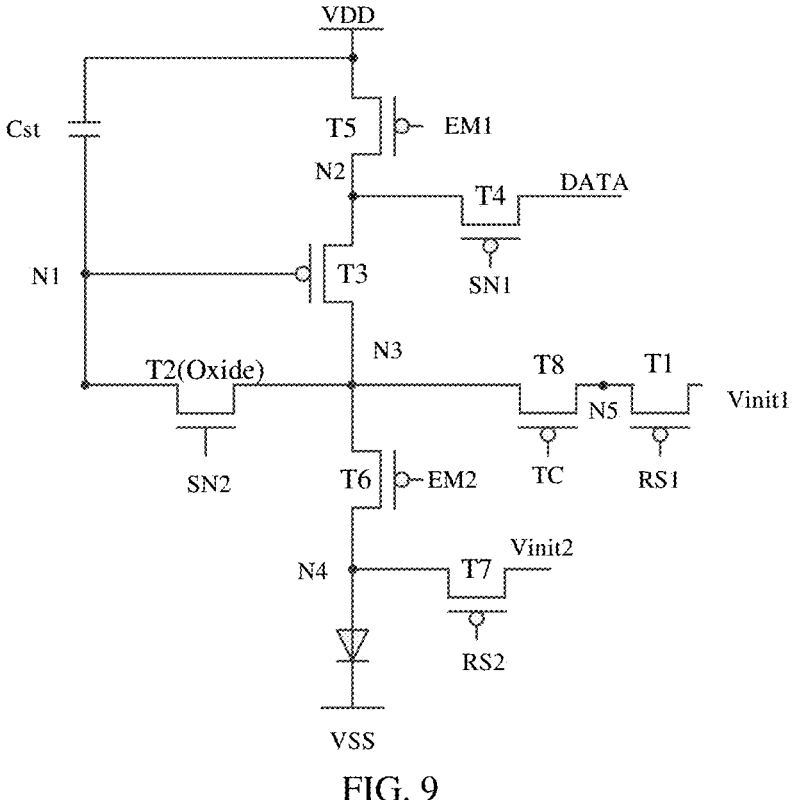
FIG. 9 is a schematic circuit structure diagram of a specific implementation example of the pixel circuit shown in FIG. 4.

FIG. 9 is a schematic circuit structure diagram of a specific implementation example of the pixel circuit shown in FIG. 4. The difference between the pixel circuit shown in FIG. 9 and the pixel circuit shown in FIG. 5 mainly lies in the connection modes of the first transistor T1 and the eighth transistor T8. It should be noted that other circuit structures in the pixel circuit shown in FIG. 9 are basically the same as those in the pixel circuit shown in FIG. 5, and the repetition will not be repeated here. For example, as shown in FIG. 9, the gate electrode of the first transistor T1 is connected to the first reset control signal terminal RS1 to receive the first reset control signal, the first electrode of the first transistor T1 is connected to the first initialization voltage terminal Vinit1 to receive the first initialization voltage, and the second electrode of the first transistor T1 is connected to the fifth node N5; the gate electrode of the eighth transistor T8 is connected to the transmission control signal terminal TC to receive the transmission control signal, the first electrode of the eighth transistor T8 is connected to the fifth node N5, and the second electrode of the eighth transistor is connected to the second terminal 130 (the third node N3) of the driving circuit 100. For instance, in some examples, in the reset stage, the first transistor T1 is turned on in response to the first reset control signal RS1, and the eighth transistor T8 is turned on in response to the transmission control signal TC, so that the first initialization voltage Vinit1 can be applied to the third node N3 through the first transistor T1 and the eighth transistor T8, and the second terminal 130 (the second electrode of the third transistor T3) of the driving circuit 100 is reset, thereby eliminating the influence of the previous light emission stage on the driving circuit 100; at the same time, the second transistor T2 is turned on in response to the second scanning signal SN2, so that the first initialization voltage Vinit1 at the third node N3 can be transmitted to the first node N1, and the control terminal 110 (the gate electrode of the third transistor T3) of the driving circuit 100 is reset, thereby eliminating the influence of the previous light emission stage on the control terminal 110 of the driving circuit 100. For example, for the pixel circuit shown in FIG. 9, the second reset control signal RS2 may be the same control signal as the first scanning signal SN1; the transmission control signal TC may be the same control signal as the first light emission control signal EM1. It should be noted that the embodiments of the present disclosure make no limitation thereto.

Figure 10:
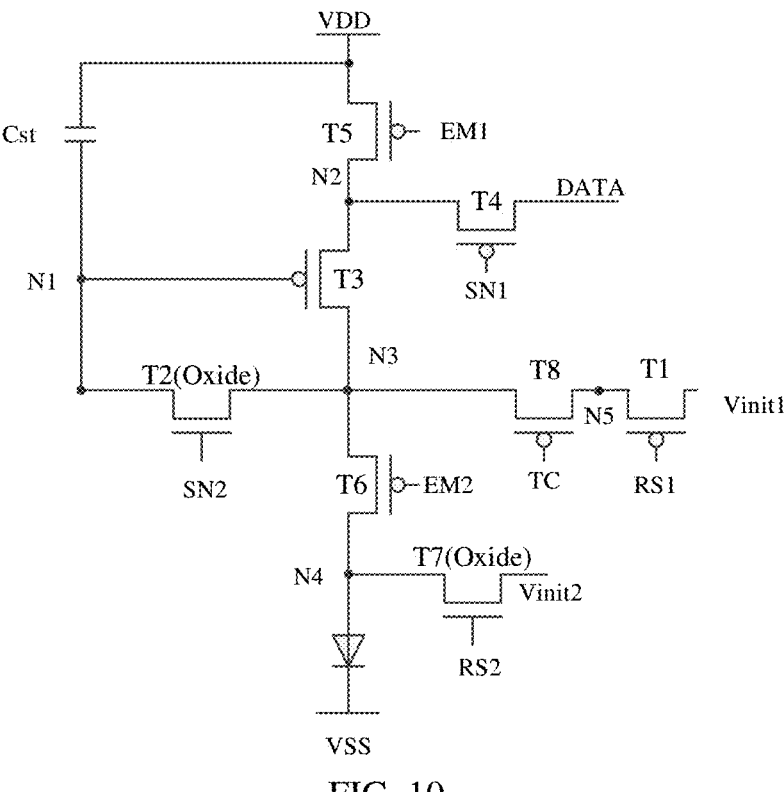
FIG. 10 is a schematic circuit structure diagram of another specific implementation example of the pixel circuit shown in FIG. 4.

FIG. 10 is a schematic circuit structure diagram of another specific implementation example of the pixel circuit shown in FIG. 4. The difference between the pixel circuit shown in FIG. 10 and the pixel circuit shown in FIG. 9 mainly lies in that, in the pixel circuit shown in FIG. 10, the seventh transistor T7 is an N-type thin film transistor, such as an N-type oxide thin film transistor, which is beneficial to reducing the size of the transistor and the leakage current of the fourth node N4. It should be noted that other circuit structures in the pixel circuit shown in FIG. 10 are basically the same as those in the pixel circuit shown in FIG. 9, and the repetition will not be repeated here.

For example, for the pixel circuit shown in FIG. 10, the second reset control signal RS2 may be the same control signal as the second light emission control signal EM2; the transmission control signal TC may be the same control signal as the first light emission control signal EM1. It should be noted that the embodiments of the present disclosure make no limitation thereto.

Figure 11A:
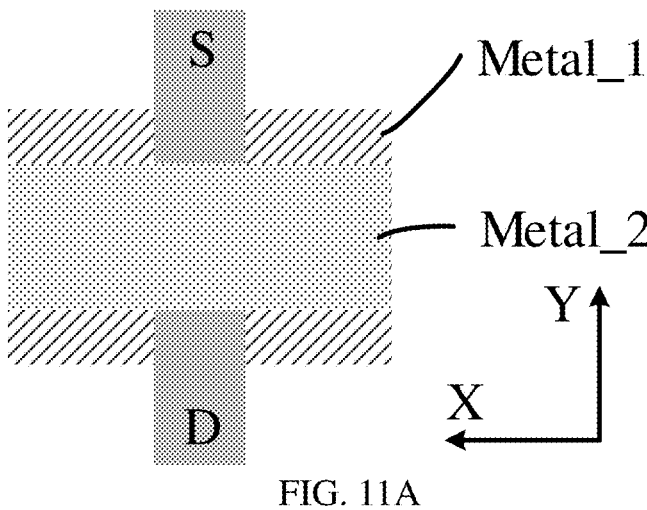
FIG. 11A is a schematic diagram of a partial plane structure of an oxide thin film transistor provided by at least some embodiments of the present disclosure.
Figure 11B:
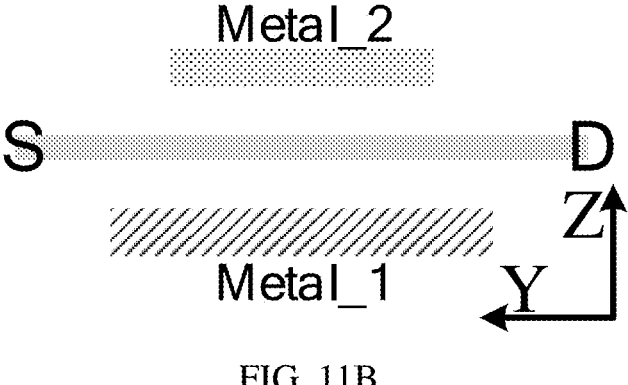
FIG. 11B is a schematic diagram of a partial cross-sectional structure of an oxide thin film transistor provided by at least some embodiments of the present disclosure.

FIG. 11A is a schematic diagram of a partial plane structure of an oxide thin film transistor provided by at least some embodiments of the present disclosure, and FIG. 11B is a schematic diagram of a partial cross-sectional structure of an oxide thin film transistor provided by at least some embodiments of the present disclosure. For example, as shown in FIGS. 11A and 11B, the oxide thin film transistor includes a first metal layer Metal_1, an active layer S/D, and a second metal layer Metal_2 which are sequentially stacked in the Z direction and insulated from each other. For example, the oxide thin film transistor is arranged on a base substrate, wherein both the X direction and the Y direction are parallel to a surface of the base substrate, and the Z direction is perpendicular to the surface of the base substrate. For example, the X direction is perpendicular to the Y direction. For example, an insulating layer (not shown in FIG. 11B) is provided between the first metal layer Metal_1 and the active layer S/D, and an insulating layer (not shown in FIG. 11B) is also provided between the active layer S/D and the second metal layer Metal_2. For example, a material of the active layer S/D can be indium gallium zinc oxide (IGZO) or the like.

For example, as shown in FIG. 11A, the active layer S/D extends in the Y direction. A width of the second metal layer Metal_2 is not greater than a width of the first metal layer Metal_1 in an extension direction of the active layer S/D (that is, the Y direction). For instance, in some examples, the second metal layer Metal_2 and the second scanning signal terminal SN2 are connected so as to serve as the gate electrode of the oxide thin film transistor (for example, the second transistor T2 and/or the seventh transistor T7, etc.); a DC signal can be input into the first metal layer Metal_1, which plays a shielding role and shields the influence of external electric field on the oxide thin film transistor. For instance, in some other examples, both the second metal layer Metal_2 and the first metal layer Metal_1 are connected to the second scanning signal terminal SN2 to serve as the gate electrode of the oxide thin film transistor (e.g., the second transistor T2 and/or the seventh transistor T7, etc.) at the same time.

For example, the active layer S/D includes a channel region covered by the first metal layer Metal_1, and a source region S and a drain region D located at both sides of the channel region. For example, the source region S and the drain region D are electrically connected to the first electrode and the second electrode of the oxide thin film transistor, respectively.

For example, a width-length ratio W/L of the channel region of the oxide thin film transistor is in a value range of [1/2, 7/8]. For example, a general value of the width-length ratio W/L of the channel region of the oxide thin film transistor is 2.5/3.0; for example, a value of W can be in the range of [1.5, 2.5], and a value of L can be in the range of [2.0, 8.0]. It should be understood that a length of the channel region refers to a dimension of the channel region in the extension direction of the active layer S/D (that is, the Y direction), while a width of the channel region refers to a dimension of the channel region in another plane direction (that is, the X direction) perpendicular to the extension direction of the active layer S/D.

For example, in some embodiments, in order to reduce the leakage current of the first node N1, the width-length ratio of the channel region of the first transistor T1 can be in the value range of [1/3, 3/4], and the width-length ratio of the channel region of the eighth transistor T8 can also be in the value range of [1/3, 3/4]. For example, the general value of the width-length ratio of the channel region of the first transistor T1 is 2.0/3.0; for example, a value of the width of the channel region of the first transistor T1 can be in the range of [1.5, 2.5], and a value of the length of the channel region of the first transistor T1 can be in the range of [2.0, 5.0]. For example, the general value of the width-length ratio of the channel region of the eighth transistor T8 is 2.0/3.0; for example, a value of the width of the channel region of the eighth transistor T8 can be in the range of [1.5, 2.5], and a value of the length of the channel region of the eighth transistor T8 can be in the range of [2.0, 5.0]. For instance, in some examples, at least one of the first transistor T1 and the eighth transistor T8 may have a double-gate structure. For example, for a transistor with a double-gate structure, the general value of the width-length ratio of the channel region thereof is 2.0/(3.0+3.0).

It should be noted that in the embodiments of the present disclosure, the storage capacitor Cst can be a capacitor device fabricated by a technological process, for example, by fabricating specialized electrodes for capacitor, each electrode of the capacitor can be implemented by a metal layer, a semiconductor layer (e.g., doped polysilicon), etc., and the capacitor can also be a parasitic capacitor between various devices and can be implemented by the transistor itself and other devices and circuits. The connection mode of the capacitor is not limited to those described above, but other suitable connection modes can also be adopted, as long as the level of the corresponding node can be stored.

It should be noted that all of the transistors used in the embodiments of the present disclosure can be thin film transistors, field effect transistors or other switching devices with the same characteristics, and all of the embodiments of the present disclosure are described with reference to the case of thin film transistors by way of example. A source electrode and a drain electrode of the transistor as used here can be symmetrical in their structures, so there can be no difference in structure between the source electrode and the drain electrode. In the embodiments of the present disclosure, in order to distinguish the two electrodes of the transistor except the gate electrode, one of them is directly described as the first electrode and the other is described as the second electrode.

In addition, it should be noted that in the embodiments of the present disclosure, for a P-type transistor, the first electrode may be the source electrode and the second electrode may be the drain electrode; for an N-type transistor, the first electrode may be the drain electrode and the second electrode may be the source electrode. It should be noted that the present disclosure includes such case but is not limited thereto. It should be noted that the embodiments of the present disclosure are all described with reference to the case where the second electrode (e.g., the cathode) of the light-emitting element LE is applied with the second power supply voltage VSS (low voltage) by way of example, and the embodiments of the present disclosure include such case but are not limited thereto. For example, it is also possible that the first electrode (e.g., the anode) of the light-emitting element LE is applied with the first power supply voltage VDD (high voltage), while the cathode thereof is directly or indirectly connected to the pixel circuit.

It should be noted that in the pixel circuit provided by the embodiments of the present disclosure, an "effective level" refers to a level at which a transistor under operation included in the pixel circuit can be turned on, and correspondingly, an "invalid level" refers to a level at which the transistor under operation included in the pixel circuit cannot be turned on (that is, the transistor is turned off). The effective level can be higher or lower than the invalid level, depending on factors such as the type of the transistor (N type or P type) in the circuit structure of the shift register unit. For example, in the embodiments of the present disclosure, for the P-type transistor, the effective level is a low level and the invalid level is a high level; for the N-type transistors, the effective level is a high level and the invalid level is a low level.

At least some embodiments of the present disclosure also provide a driving method of a pixel circuit. FIGS. 12-18 are signal timing diagrams of driving methods of various pixel circuits provided by at least some embodiments of the present disclosure. For example, the signal timings shown in FIGS. 12-14 all can be used to drive the pixel circuit 10 shown in FIG. 2, the signal timings shown in FIGS. 12 and 14 can also be used to drive the pixel circuit 10 shown in FIG. 3, and the signal timings shown in FIGS. 13 and 15 both can be used to drive the pixel circuit 10 shown in FIG. 4. Hereinafter, the driving method of the pixel circuit 10 shown in FIGS. 2-4 (wherein the pixel circuit shown in FIG. 2 is specifically implemented as the circuit structure shown in FIG. 5 or FIG. 6, the pixel circuit shown in FIG. 3 is specifically implemented as the circuit structure shown in FIG. 7 or FIG. 8, and the pixel circuit shown in FIG. 4 is specifically implemented as the circuit structure shown in FIG. 9 or FIG. 10) will be described below with reference to the signal timings shown in FIGS. 12-18. It should be noted that, whether the potential of the signal timing shown in FIGS. 12-18 is a high level or a low level is only schematic and does not represent a real potential value or a relative proportion. Now turning to the embodiments of the present disclosure, a low-level signal corresponds to a turned-on signal of a P-type transistor or a turned-off signal of an N-type transistor, while a high-level signal corresponds to a turned-off signal of the P-type transistor or a turned-on signal of the N-type transistor.

For example, as shown in FIGS. 12-18, a display process of each frame of image can include five stages, namely, a reset stage t1, a data writing and compensation stage t2, a holding stage t3-t4 and a light emission stage t5, respectively. Timing waveforms of control signals in each stage are shown in FIGS. 12-18.

In the reset stage t1, the second light emission control signal EM2, the first reset control signal RS1, the second reset control signal RS2 and the transmission control signal TC are input; the second light emission control circuit 500, the first initialization circuit 600, the second initialization circuit 700 and the transmission circuit 800 are turned on; the first initialization voltage Vinit1 is applied to the control terminal 110 of the driving circuit 100 through the first initialization circuit 600 and the transmission circuit 800 to reset the control terminal 110 of the driving circuit 100, the second initialization voltage Vinit2 is applied to the first electrode of the light-emitting element 900 through the second initialization circuit 700 to reset the light-emitting element 900, and the second initialization voltage Vinit2 is applied to the second terminal 130 of the driving circuit 100 through the second initialization circuit 700 and the second light emission control circuit 500 to reset the second terminal 130 of the driving circuit 100. Alternatively, in the reset stage t1, the second scanning signal SN2, the first reset control signal RS1, the second reset control signal RS2 and the transmission control signal TC are input; the compensation control circuit 300, the first initialization circuit 600, the second initialization circuit 700 and the transmission circuit 800 are turned on; the first initialization voltage Vinit1 is applied to the control terminal 110 of the driving circuit 100 through the first initialization circuit 600 and the transmission circuit 800 to reset the control terminal 110 of the driving circuit 100, the first initialization voltage Vinit1 is applied to the second terminal 130 of the driving circuit 100 through the first initialization circuit 600, the transmission circuit 800 and the compensation control circuit 300 to reset the second terminal 130 of the driving circuit 100, and the second initialization voltage Vinit2 is applied to the first electrode of the light-emitting element 900 through the second initialization circuit 700 to reset the light-emitting element 900. Alternatively, in the reset stage t1, the second scanning signal SN2, the first reset control signal RS1, the second reset control signal RS2 and the transmission control signal TC are input; the compensation control circuit 300, the first initialization circuit 600, the second initialization circuit 700 and the transmission circuit 800 are turned on; the first initialization voltage Vinit1 is applied to the second terminal 130 of the driving circuit 100 through the first initialization circuit 600 and the transmission circuit 800 to reset the second terminal 130 of the driving circuit 100, the first initialization voltage Vinit1 is applied to the control terminal 110 of the driving circuit 100 through the first initialization circuit 600, the transmission circuit 800 and the compensation control circuit 300 to reset the control terminal 110 of the driving circuit 100, and the second initialization voltage Vinit2 is applied to the first electrode of the light-emitting element 900 through the second initialization circuit 700 to reset the light-emitting element 900.

Figure 12:
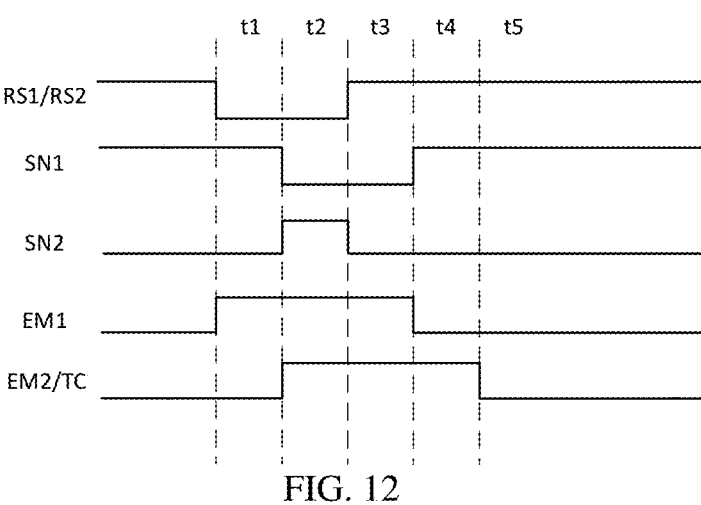
FIGS. 12-15 are signal timing diagrams of driving methods of various pixel circuits provided by at least some embodiments of the present disclosure.

For example, referring to the circuit structure shown in FIG. 5 and the signal timing shown in FIG. 12, in the reset stage t1, the sixth transistor T6 of P type is turned on by the low level of the second light emission control signal EM2, the first transistor T1 of P type is turned on by the low level of the first reset control signal RS1, the seventh transistor T7 of P type is turned on by the low level of the second reset control signal RS2, and the eighth transistor T8 of P type is turned on by the low level of the transmission control signal TC; at the same time, the second transistor T2 of N type is turned off by the low level of the second scanning signal SN2, the fourth transistor T4 of P type is turned off by the high level of the first scanning signal SN1, and the fifth transistor T5 of P type is turned off by the high level of the first light emission control signal EM1. In this way, the first reset voltage Vinit1 can be transmitted to the first node N1 through the turned-on first transistor T1 and the turned-on eighth transistor T8 to reset the first node N1 (the control terminal 110 of the driving circuit 100) to Vinit1; the second reset voltage Vinit2 can be transmitted to the fourth node N4 through the turned-on seventh transistor T7, and further transmitted to the third node N3 through the turned-on sixth transistor T6 so as to reset the fourth node N4 (the first electrode of the light-emitting element LE) and the third node N3 (the second terminal 130 of the driving circuit 100) to Vinit2. Therefore, the display device using the above-described pixel circuit will reset the first node N1, the third node N3 and the fourth node N4 every time when the screen is switched, so that the influence of hysteresis can be eliminated.

Figure 13:
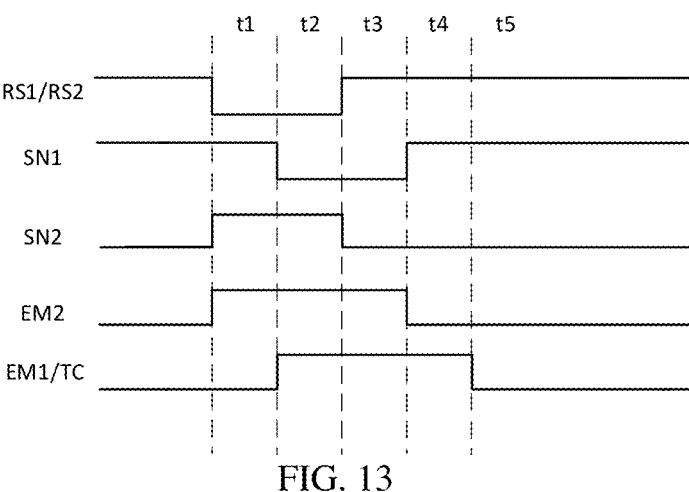

For example, referring to the circuit structure shown in FIG. 5 and the signal timing shown in FIG. 13, in the reset stage T1, the fifth transistor T5 of P type is turned on by the low level of the first light emission control signal EM1, the first transistor T1 of P type is turned on by the low level of the first reset control signal RS1, the seventh transistor T7 of P type is turned on by the low level of the second reset control signal RS2, the eighth transistor T8 of P type is turned on by the low level of the transmission control signal TC, and the second transistor T2 of N type is turned on by the high level of the second scanning signal SN2; at the same time, the fourth transistor T4 of P type is turned off by the high level of the first scanning signal SN1, and the sixth transistor T6 of P type is turned off by the high level of the second light emission control signal EM2. In this way, a conducted path can be formed between the first power supply terminal VDD and the first initialization voltage terminal Vinit1 via the fifth transistor T5, the third transistor T3, the second transistor T2, the eighth transistor T8 and the first transistor t1 which are turned on, so as to reset the first node N1, the second node N2 and the third node N3 at the same time; the second reset voltage Vinit2 can be transmitted to the fourth node N4 through the turned-on seventh transistor T7 to reset the fourth node N4 (the first electrode of the light-emitting element LE) to Vinit2. Therefore, the display device using the above-described pixel circuit will reset the first node N1, the second node N2, the third node N3 and the fourth node N4 every time when the screen is switched, thereby eliminating the influence of hysteresis.

Figure 14:
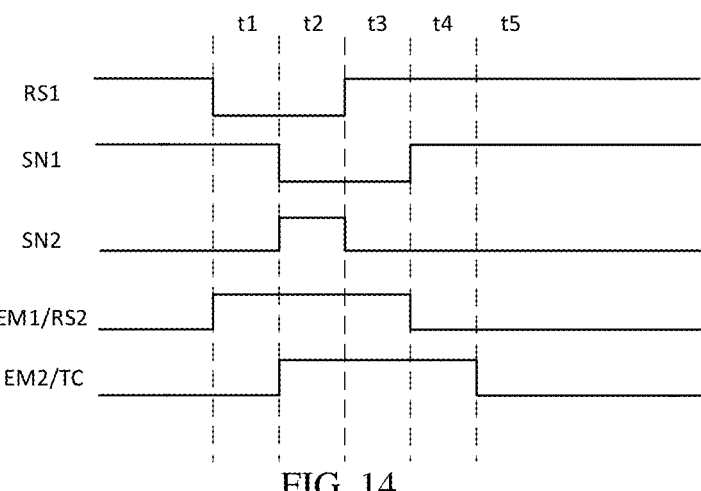

For example, the working principle of the reset stage t1 corresponding to the circuit structure shown in FIG. 6 and the signal timing shown in FIG. 14 is basically the same as that of the reset stage t1 corresponding to the circuit structure shown in FIG. 5 and the signal timing shown in FIG. 12 (the only difference is the type of the seventh transistor T7 and the effective level of the corresponding second reset control signal RS2), and the repetition will not be repeated here.

For example, referring to the circuit structure shown in FIG. 7 and the signal timing shown in FIG. 12, in the reset stage t1, the sixth transistor T6 of P type is turned on by the low level of the second light emission control signal EM2, the first transistor T1 of P type is turned on by the low level of the first reset control signal RS1, the seventh transistor T7 of P type is turned on by the low level of the second reset control signal RS2, and the eighth transistor T8 of P type is turned on by the low level of the transmission control signal TC; at the same time, the second transistor T2 of N type is turned off by the low level of the second scanning signal SN2, the fourth transistor T4 of P type is turned off by the high level of the first scanning signal SN1, and the fifth transistor T5 of P type is turned off by the high level of the first light emission control signal EML In this way, the first reset voltage Vinit1 can be transmitted to the first node N1 through the turned-on eighth transistor T8 and the turned-on first transistor T1 to reset the first node N1 (the control terminal 110 of the driving circuit 100) to Vinit1; the second reset voltage Vinit2 can be transmitted to the fourth node N4 through the turned-on seventh transistor T7, and further transmitted to the third node N3 through the turned-on sixth transistor T6 to reset the fourth node N4 (the first electrode of the light-emitting element LE) and the third node N3 (the second terminal 130 of the driving circuit 100) to Vinit2. Therefore, the display device using the above-described pixel circuit will reset the first node N1, the third node N3 and the fourth node N4 every time when the screen is switched, so that the influence of hysteresis can be eliminated.

For example, the working principle of the reset stage t1 corresponding to the circuit structure shown in FIG. 8 and the signal timing shown in FIG. 14 is basically the same as that of the reset stage t1 corresponding to the circuit structure shown in FIG. 7 and the signal timing shown in FIG. 12 (the only difference is the type of the seventh transistor T7 and the effective level of the corresponding second reset control signal RS2), and the repetition will not be repeated here.

For example, referring to the circuit structure shown in FIG. 9 and the signal timing shown in FIG. 13, in the reset stage t1, the fifth transistor T5 of P type is turned on by the low level of the first light emission control signal EM1, the first transistor T1 of P type is turned on by the low level of the first reset control signal RS1, the seventh transistor T7 of P type is turned on by the low level of the second reset control signal RS2, the eighth transistor T8 of P type is turned on by the low level of the transmission control signal TC, and the second transistor T2 of N type is turned on by the high level of the second scanning signal SN2; at the same time, the fourth transistor T4 of P type is turned off by the high level of the first scanning signal SN1, and the sixth transistor T6 of P type is turned off by the high level of the second light emission control signal EM2. In this way, the first initialization voltage Vinit1 can be applied to the third node N3 through the turned-on first transistor T1 and the turned-on eighth transistor T8, and then applied to the first node N1 through the turned-on second transistor T2 to reset the first node N1; meanwhile, a conducted path can be formed between the first power supply terminal VDD and the first initialization voltage terminal Vinit1 via the turned-on fifth transistor T5, the turned-on third transistor T3, the turned-on eighth transistor T8 and the turned-on first transistor T1 to reset the second node N2 and the third node N3 at the same time; the second reset voltage Vinit2 can be transmitted to the fourth node N4 through the turned-on seventh transistor T7 to reset the fourth node N4 (the first electrode of the light-emitting element LE) to Vinit2. Therefore, the display device using the above-described pixel circuit will reset the first node N1, the second node N2, the third node N3 and the fourth node N4 every time when the screen is switched, thereby eliminating the influence of hysteresis.

Figure 15:
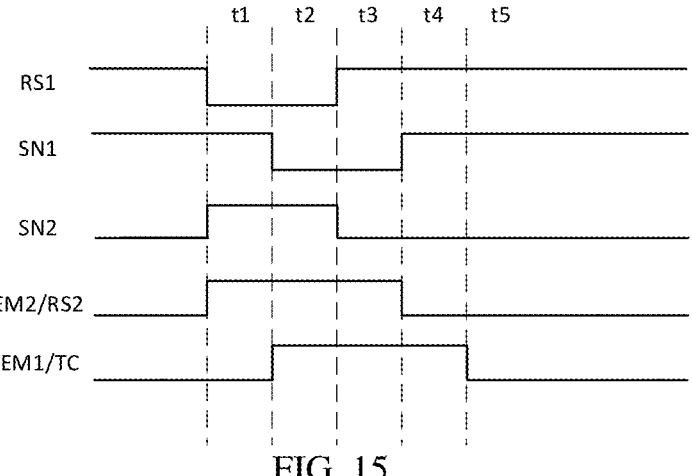

For example, the working principle of the reset stage t1 corresponding to the circuit structure shown in FIG. 10 and the signal timing shown in FIG. 15 is basically the same as that of the reset stage t1 corresponding to the circuit structure shown in FIG. 9 and the signal timing shown in FIG. 13 (the only difference is the type of the seventh transistor T7 and the effective level of the corresponding second reset control signal RS2), and the repetition will not be repeated here.

In the data writing and compensation stage t2, the first scanning signal SN1 and the second scanning signal SN2 are input; the data writing circuit 200, the driving circuit 100 and the compensation control circuit 300 are turned on; the data signal Vdata is written into the compensation control circuit 300 by the data writing circuit 200; and the driving circuit 100 is compensated by the compensation control circuit 300.

For example, referring to the circuit structure shown in FIG. 5 and the signal timing shown in FIG. 12, in the data writing and compensation stage t2, the first transistor T1 of P type is turned on by the low level of the first reset control signal RS1, the seventh transistor T7 of P type is turned on by the low level of the second reset control signal RS2, the second transistor T2 of N type is turned on by the high level of the second scanning signal SN2, and the fourth transistor T4 of P type is turned on by the low level of the first scanning signal SN1; at this time, due to the turn-on of the second transistor T2, the third transistor T3 is in a diode-like connection mode (the gate electrode of the third transistor T3 is connected to the second electrode of the third transistor T3); at the same time, the sixth transistor T6 of P type is turned off by the high level of the second light emission control signal EM2, the eighth transistor T8 of P type is turned off by the high level of the transmission control signal TC, and the fifth transistor T5 of P type is turned off by the high level of the first light emission control signal EM1. In this way, the second reset voltage Vinit2 can still be transmitted to the fourth node N4 through the turned-on seventh transistor T7 to continuously reset the fourth node N4 (the first electrode of the light-emitting element LE); the data signal Vdata charges the first node N1 (that is, charging the first electrode of the capacitor Cst) through the fourth transistor T4, the third transistor T3 and the second transistor T2 which are turned on. It is easy to understand that the potential of the second node N2 remains as Vdata; and at the same time, according to the characteristics of the third transistor T3 per se, when the potential of the first node N1 (that is, the potential of the first electrode of the storage capacitor Cst) reaches Vdata+Vth, the third transistor T3 is turned off and the charging process is ended. It should be noted that Vdata represents the voltage value of the data signal, and Vth represents the threshold voltage of the third transistor T3. Because the third transistor T3 is a P-type transistor in this embodiment, the threshold voltage Vth here may be a negative value. It should be noted that at this stage, the first reset control signal RS1 and the second reset control signal RS2 can also be adjusted, so that the first transistor T1 and the seventh transistor T7 are turned off without affecting the subsequent light emission stage of the pixel circuit, which is not limited by the embodiments of the present disclosure.

For example, the working principle of the data writing and compensation stage t2 corresponding to the circuit structure shown in FIG. 5 and the signal timing shown in FIG. 13 is basically the same as that of the data writing and compensation stage t2 corresponding to the circuit structure shown in FIG. 5 and the signal timing shown in FIG. 12, and the repetition will not be repeated here.

For example, the working principle of the data writing and compensation stage t2 corresponding to the circuit structure shown in FIG. 6 and the signal timing shown in FIG. 14 is basically the same as that of the data writing and compensation stage t2 corresponding to the circuit structure shown in FIG. 5 and the signal timing shown in FIG. 12 (the only difference is the type of the seventh transistor T7 and the effective level of the corresponding second reset control signal RS2), and the repetition will not be repeated here.

For example, referring to the circuit structure shown in FIG. 7 and the signal timing shown in FIG. 12, in the data writing and compensation stage t2, the first transistor T1 of P type is turned on by the low level of the first reset control signal RS1, the seventh transistor T7 of P type is turned on by the low level of the second reset control signal RS2, the second transistor T2 of N type is turned on by the high level of the second scanning signal SN2, and the fourth transistor T4 of P type is turned on by the low level of the first scanning signal SN1; at this time, due to the turn-on of the second transistor T2, the third transistor T3 is in a diode-like connection mode (the gate electrode of the third transistor T3 is connected to the second electrode of the third transistor T3); at the same time, the sixth transistor T6 of P type is turned off by the high level of the second light emission control signal EM2, the eighth transistor T8 of P type is turned off by the high level of the transmission control signal TC, and the fifth transistor T5 of P type is turned off by the high level of the first light emission control signal EML In this way, the second reset voltage Vinit2 can still be transmitted to the fourth node N4 through the turned-on seventh transistor T7 to continuously reset the fourth node N4 (the first electrode of the light-emitting element LE); the data signal Vdata charges the first node N1 (i.e., charging the first electrode of the capacitor Cst) through the turned-on fourth transistor T4, the turned-on third transistor T3, the turned-on second transistor T2 and the turned-on first transistor T1. It is easy to understand that the potential of the second node N2 remains at Vdata; and at the same time, according to the characteristics of the third transistor T3 per se, when the potential of the first node N1 (that is, the potential of the first electrode of the storage capacitor Cst) reaches Vdata+Vth, the third transistor T3 is turned off and the charging process is ended. It should be noted that Vdata represents the voltage value of the data signal, and Vth represents the threshold voltage of the third transistor T3. Because the third transistor T3 is a P-type transistor in this embodiment, the threshold voltage Vth here may be a negative value. It should be noted that at this stage, the second reset control signal RS2 can also be adjusted to turn off the seventh transistor T7 without affecting the subsequent light emission stage of the pixel circuit, which is not limited by the embodiments of the present disclosure. For example, the working principle of the data writing and compensation stage t2 corresponding to the circuit structure shown in FIG. 8 and the signal timing shown in FIG. 14 is basically the same as that of the data writing and compensation stage t2 corresponding to the circuit structure shown in FIG. 7 and the signal timing shown in FIG. 12 (the only difference is the type of the seventh transistor T7 and the effective level of the corresponding second reset control signal RS2), and the repetition will not be repeated here.

For example, the working principle of the data writing and compensation stage t2 corresponding to the circuit structure shown in FIG. 9 and the signal timing shown in FIG. 13 is basically the same as that of the data writing and compensation stage t2 corresponding to the circuit structure shown in FIG. 5 and the signal timing shown in FIG. 13, and the repetition will not be repeated here.

For example, the working principle of the data writing and compensation stage t2 corresponding to the circuit structure shown in FIG. 10 and the signal timing shown in FIG. 15 is basically the same as that of the data writing and compensation stage t2 corresponding to the circuit structure shown in FIG. 9 and the signal timing shown in FIG. 13 (the only difference is the type of the seventh transistor T7 and the effective level of the corresponding second reset control signal RS2), and the repetition will not be repeated here.

It should be noted that in some embodiments of the present disclosure, there may be a certain time interval between the reset stage t1 and the data writing and compensation stage t2, for example, the time interval may be longer than a predetermined time interval, so as to relieve the hysteresis phenomenon of the third transistor and reduce the high and low frequency flicker of the pixel circuit by resetting the potential of the gate electrode of the third transistor T3 in advance.

In the holding stage t3 and t4, the second scanning signal SN2 is input, the compensation control circuit 300 is turned off, and the voltage of the control terminal 110 of the driving circuit 100 is held by the energy storage circuit 350.

For example, the holding stage t3 and t4 includes a first holding stage t3 and a second holding stage t4.

For example, referring to the circuit structure shown in FIG. 5 and the signal timing shown in FIG. 12, in the first holding stage t3, the fourth transistor T4 of P type is turned on by the low level of the first scanning signal SN1; at the same time, the first transistor T1 of P type is turned off by the high level of the first reset control signal RS1, the seventh transistor T7 of P type is turned off by the high level of the second reset control signal RS2, the second transistor T2 of N type is turned off by the low level of the second scanning signal SN2, the sixth transistor T6 of P type is turned off by the high level of the second light emission control signal EM2, the eighth transistor T8 of P type is turned off by the high level of the transmission control signal TC, and the fifth transistor T5 of P type is turned off by the high level of the first light emission control signal EML In this way, in the first holding stage t3, the fourth transistor T4 is turned on, the data signal Vdata is continuously written into the second node N2, and the potential of the second node N2 remains at Vdata; the third transistor T3 is turned off, and the potential of the first node N1 remains at Vdata+Vth due to the characteristics of the storage capacitor Cst, so as to provide grayscale display data and compensate for the threshold voltage of the third transistor T3 per se in the subsequent light emission stage. In the second holding stage t4, the fifth transistor T5 of P type is turned on by the low level of the first light emission control signal EM1; at the same time, the fourth transistor T4 of P type is turned off by the high level of the first scanning signal SN1, the first transistor T1 of P type is turned off by the high level of the first reset control signal RS1, the seventh transistor T7 of P type is turned off by the high level of the second reset control signal RS2, the second transistor T2 of N type is turned off by the low level of the second scanning signal SN2, the sixth transistor T6 of P type is turned off by the high level of the second light emission control signal EM2, and the eighth transistor T8 of P type is turned off by the high level of the transmission control signal TC. In this way, in the second holding stage t4, the potential of the first node N1 still remains at Vdata+Vth due to the characteristics of the storage capacitor Cst; the first power supply terminal VDD charges the second node N2 through the turned-on fifth transistor T5, and the potential of the second node N2 changes from Vdata to the first power supply voltage VDD; at this stage, because the sixth transistor T6 is turned off, it prepares for the light emission of the light-emitting element LE in the next stage.

For example, referring to the circuit structure shown in FIG. 5 and the signal timing shown in FIG. 13, in the first holding stage t3, the fourth transistor T4 of P type is turned on by the low level of the first scanning signal SN1; at the same time, the first transistor T1 of P type is turned off by the high level of the first reset control signal RS1, the seventh transistor T7 of P type is turned off by the high level of the second reset control signal RS2, the second transistor T2 of N type is turned off by the low level of the second scanning signal SN2, the sixth transistor T6 of P type is turned off by the high level of the second light emission control signal EM2, the eighth transistor T8 of P type is turned off by the high level of the transmission control signal TC, and the fifth transistor T5 of P type is turned off by the high level of the first light emission control signal EML In this way, in the first holding stage t3, the fourth transistor T4 is turned on, the data signal Vdata is continuously written into the second node N2, and the potential of the second node N2 remains at Vdata; the third transistor T3 is turned off, and the potential of the first node N1 remains at Vdata+Vth due to the characteristics of the storage capacitor Cst, so as to provide grayscale display data and compensate for the threshold voltage of the third transistor T3 per se in the subsequent light emission stage. In the second holding stage t4, the sixth transistor T6 of P type is turned on by the low level of the second light emission control signal EM2; at the same time, the fourth transistor T4 of P type is turned off by the high level of the first scanning signal SN1, the first transistor T1 of P type is turned off by the high level of the first reset control signal RS1, the seventh transistor T7 of P type is turned off by the high level of the second reset control signal RS2, the second transistor T2 of N type is turned off by the low level of the second scanning signal SN2, the fifth transistor T5 of P type is turned off by the high level of the first light emission control signal EM1, and the eighth transistor T8 of P type is turned off by the high level of the transmission control signal TC. In this way, in the second holding stage t4, the potential of the first node N1 still remains at Vdata+Vth due to the characteristics of the storage capacitor Cst; the third node N3 is connected to the fourth node N4 through the turned-on sixth transistor T6; at this stage, because the fifth transistor T5 is turned off, it prepares for the light emission of the light-emitting element LE in the next stage.

For example, referring to the circuit structure shown in FIG. 6 and the signal timing shown in FIG. 14, in the first holding stage t3, the fourth transistor T4 of P type is turned on by the low level of the first scanning signal SN1, and the seventh transistor T7 of N type is turned on by the high level of the second reset control signal RS2; at the same time, the first transistor T1 of P type is turned off by the high level of the first reset control signal RS1, the second transistor T2 of N type is turned off by the low level of the second scanning signal SN2, the sixth transistor T6 of P type is turned off by the high level of the second light emission control signal EM2, the eighth transistor T8 of P type is turned off by the high level of the transmission control signal TC, and the fifth transistor T5 of P type is turned off by the high level of the first light emission control signal EM1. In this way, in the first holding stage t3, the fourth transistor T4 is turned on, the data signal Vdata is continuously written into the second node N2, and the potential of the second node N2 remains at Vdata; the third transistor T3 is turned off, and the potential of the first node N1 remains at Vdata+Vth due to the characteristics of the storage capacitor Cst, so as to provide grayscale display data and compensate for the threshold voltage of the third transistor T3 per se in the subsequent light emission stage; in addition, the second reset voltage Vinit2 can still be transmitted to the fourth node N4 through the turned-on seventh transistor T7 to continuously reset the fourth node N4 (the first electrode of the light-emitting element LE). It should be noted that at this stage, the second reset control signal RS2 can also be adjusted to turn off the seventh transistor T7 without affecting the subsequent light emission stage of the pixel circuit, which is not limited by the embodiments of the present disclosure. In the second holding stage t4, the fifth transistor T5 of P type is turned on by the low level of the first light emission control signal EM1; at the same time, the fourth transistor T4 of P type is turned off by the high level of the first scanning signal SN1, the first transistor T1 of P type is turned off by the high level of the first reset control signal RS1, the seventh transistor T7 of N type is turned off by the low level of the second reset control signal RS2, the second transistor T2 of N type is turned off by the low level of the second scanning signal SN2, the sixth transistor T6 of P type is turned off by the high level of the second light emission control signal EM2, and the eighth transistor T8 of P type is turned off by the high level of the transmission control signal TC. In this way, in the second holding stage t4, the potential of the first node N1 still remains at Vdata+Vth due to the characteristics of the storage capacitor Cst; the first power supply terminal VDD charges the second node N2 through the turned-on fifth transistor T5, and the potential of the second node N2 changes from Vdata to the first power supply voltage VDD; at this stage, because the sixth transistor T6 is turned off, it prepares for the light emission of the light-emitting element LE in the next stage.

For example, the working principle of the holding stage t3-t4 corresponding to the circuit structure shown in FIG. 7 and the signal timing shown in FIG. 12 is basically the same as that of the holding stage t3-t4 corresponding to the circuit structure shown in FIG. 5 and the signal timing shown in FIG. 12, and the repetition will not be repeated here.

For example, the working principle of the holding stage t3-t4 corresponding to the circuit structure shown in FIG. 8 and the signal timing shown in FIG. 14 is basically the same as that of the holding stage t3-t4 corresponding to the circuit structure shown in FIG. 6 and the signal timing shown in FIG. 14, and the repetition will not be repeated here.

For example, the working principle of the holding stage t3-t4 corresponding to the circuit structure shown in FIG. 9 and the signal timing shown in FIG. 13 is basically the same as that of the holding stage t3-t4 corresponding to the circuit structure shown in FIG. 5 and the signal timing shown in FIG. 13, and the repetition will not be repeated here.

For example, referring to the circuit structure shown in FIG. 10 and the signal timing shown in FIG. 15, in the first holding stage t3, the fourth transistor T4 of P type is turned on by the low level of the first scanning signal SN1, and the seventh transistor T7 of N type is turned on by the high level of the second reset control signal RS2; at the same time, the first transistor T1 of P type is turned off by the high level of the first reset control signal RS1, the second transistor T2 of N type is turned off by the low level of the second scanning signal SN2, the sixth transistor T6 of P type is turned off by the high level of the second light emission control signal EM2, the eighth transistor T8 of P type is turned off by the high level of the transmission control signal TC, and the fifth transistor T5 of P type is turned off by the high level of the first light emission control signal EM1. In this way, in the first holding stage t3, the fourth transistor T4 is turned on, the data signal Vdata is continuously written into the second node N2, and the potential of the second node N2 remains at Vdata; the third transistor T3 is turned off, and the potential of the first node N1 remains at Vdata+Vth due to the characteristics of the storage capacitor Cst, so as to provide grayscale display data and compensate for the threshold voltage of the third transistor T3 per se in the subsequent light emission stage; in addition, the second reset voltage Vinit2 can still be transmitted to the fourth node N4 through the turned-on seventh transistor T7 to continuously reset the fourth node N4 (the first electrode of the light-emitting element LE). It should be noted that at this stage, the second reset control signal RS2 can also be adjusted to turn off the seventh transistor T7 without affecting the subsequent light emission stage of the pixel circuit, which is not limited by the embodiments of the present disclosure. In the second holding stage t4, the sixth transistor T6 of P type is turned on by the low level of the second light emission control signal EM2; at the same time, the fourth transistor T4 of P type is turned off by the high level of the first scanning signal SN1, the first transistor T1 of P type is turned off by the high level of the first reset control signal RS1, the seventh transistor T7 of N type is turned off by the low level of the second reset control signal RS2, the second transistor T2 of N type is turned off by the low level of the second scanning signal SN2, the fifth transistor T5 of P type is turned off by the high level of the first light emission control signal EM1, and the eighth transistor T8 of P type is turned off by the high level of the transmission control signal TC. In this way, in the second holding stage t4, the potential of the first node N1 still remains at Vdata+Vth due to the characteristics of the storage capacitor Cst; the third node N3 is connected to the fourth node N4 through the turned-on sixth transistor T6; at this stage, because the fifth transistor T5 is turned off, it prepares for the light emission of the light-emitting element LE in the next stage.

In the light emission stage t5, the first light emission control signal EM1 and the second light emission control signal EM2 are input; the first light emission control circuit 400, the second light emission control circuit 500 and the driving circuit 100 are turned on; the first power supply voltage VDD is applied to the first terminal 120 of the driving circuit 100 through the first light emission control circuit 400 to allow the driving circuit 100 to generate a driving current according to the voltage of the control terminal 110 of the driving circuit 100; and the driving current is applied to the light-emitting element 900 through the second light emission control circuit 500 to allow the light-emitting element 900 to emit light.

For example, referring to the circuit structure shown in FIG. 5 and the signal timing shown in FIG. 12, in the light emission stage t5, the fifth transistor t5 of P type is turned on by the low level of the first light emission control signal EM1, and the sixth transistor T6 of P type is turned on by the low level of the second light emission control signal EM2; at the same time, the first transistor T1 of P type is turned off by the high level of the first reset control signal RS1, the seventh transistor T7 of P type is turned off by the high level of the second reset control signal RS2, the second transistor T2 of N type is turned off by the low level of the second scanning signal SN2, the eighth transistor T8 of P type is turned off by the high level of the transmission control signal TC, and the fourth transistor T4 of P type is turned on by the low level of the first scanning signal SN1. In addition, the potential of the first node N1 is Vdata+Vth, and the potential of the second node N2 is VDD; therefore, at this stage, the third transistor T3 also remains turned-on. The driving current generated by the third transistor T3 can be obtained according to the following formula:

$$1 = 0.5\mu\, Cox * \left(\frac{w}{L}\right) * (V_{gs} - V_{th})^2$$
$$= 0.5\mu\, Cox * \left(\frac{w}{L}\right) * ((V_{data} + V_{th} - VDD) - V_{th})^2$$
$$= 0.5\mu\, Cox * \left(\frac{w}{L}\right) * (V_{data} - VDD)^2$$

where $\mu$ represents a carrier mobility, Cox represents a gate capacitance per unit area, W represents the width of the channel region of the third transistor, L represents the length of the channel region of the third transistor, Vgs represents a gate-source voltage difference of the third transistor, Vth represents the threshold voltage of the third transistor, and VDD represents the first power supply voltage provided by the first power supply terminal VDD. As can be seen from the above formula, the driving current $I_{LE}$ flowing through the light-emitting element OLED is no longer related to the threshold voltage Vth of the third transistor T3, but only related to the data signal Vdata that controls the grayscale of the light emission of the pixel circuit, so that the compensation for the pixel circuit can be realized, the problem of threshold voltage drift of the third transistor T3 due to the manufacturing process as well as long-term operation and usage can be solved, and the influence of the drift on the driving current can be eliminated, thereby improving the display effect.

For example, the working principle of the light emission stage t5 corresponding to the circuit structure shown in FIG. 5 and the signal timing shown in FIG. 13 is basically the same as that of the light emission stage t5 corresponding to the circuit structure shown in FIG. 5 and the signal timing shown in FIG. 12, and the repetition will not be repeated here.

For example, the working principle of the light emission stage t5 corresponding to the circuit structure shown in FIG. 6 and the signal timing shown in FIG. 14 is basically the same as that of the light emission stage t5 corresponding to the circuit structure shown in FIG. 5 and the signal timing shown in FIG. 12, and the repetition will not be repeated here.

For example, the working principle of the light emission stage t5 corresponding to the circuit structure shown in FIG. 7 and the signal timing shown in FIG. 12 is basically the same as that of the light emission stage t5 corresponding to the circuit structure shown in FIG. 5 and the signal timing shown in FIG. 12, and the repetition will not be repeated here.

For example, the working principle of the light emission stage t5 corresponding to the circuit structure shown in FIG. 8 and the signal timing shown in FIG. 14 is basically the same as that of the light emission stage t5 corresponding to the circuit structure shown in FIG. 5 and the signal timing shown in FIG. 12, and the repetition will not be repeated here.

For example, the working principle of the light emission stage t5 corresponding to the circuit structure shown in FIG. 9 and the signal timing shown in FIG. 13 is basically the same as that of the light emission stage t5 corresponding to the circuit structure shown in FIG. 5 and the signal timing shown in FIG. 12, and the repetition will not be repeated here.

For example, the working principle of the light emission stage t5 corresponding to the circuit structure shown in FIG. 10 and the signal timing shown in FIG. 15 is basically the same as that of the light emission stage t5 corresponding to the circuit structure shown in FIG. 5 and the signal timing shown in FIG. 12, and the repetition will not be repeated here.

It should be noted that the signal timing diagrams shown in FIGS. 12-15 are schematic, and the signal timing of the pixel circuit provided by the embodiments of the present disclosure can be determined according to actual needs, which is not limited by the present disclosure.

Figure 16:
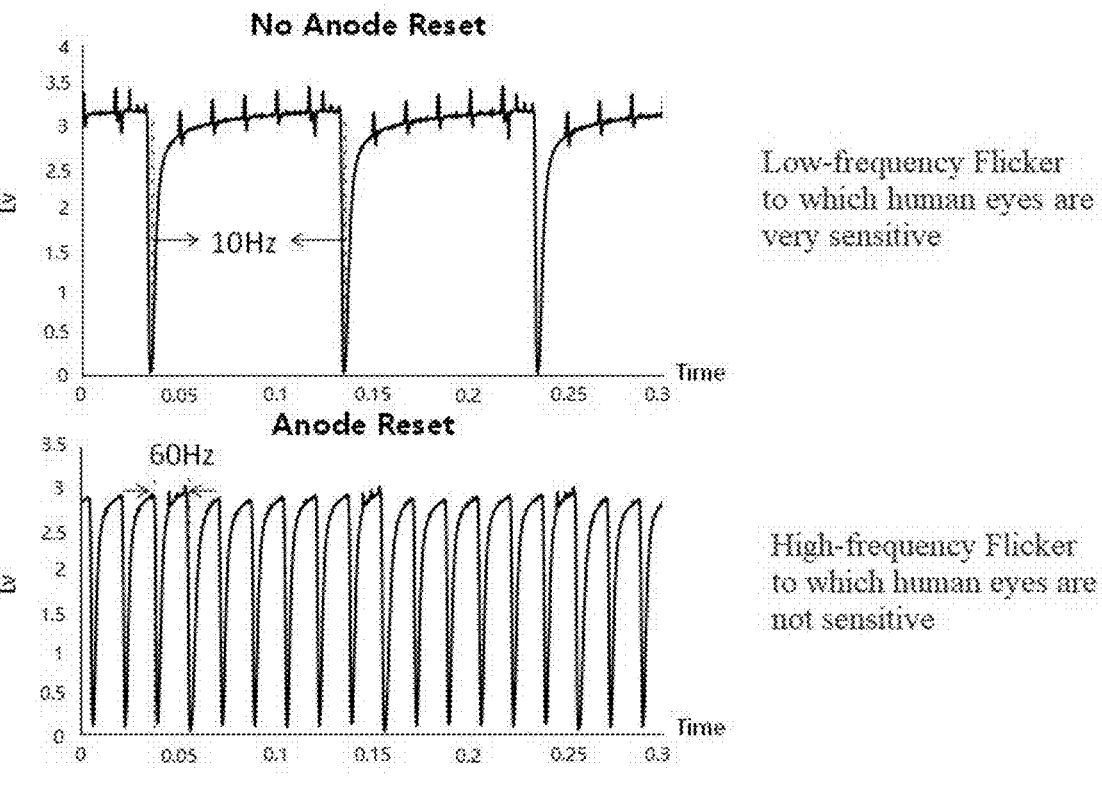
FIG. 16 is a schematic diagram showing the effect of a PWM reset performed on a fourth node in a driving method of a pixel circuit provided by at least some embodiments of the present disclosure.

For example, in the driving method of the pixel circuit described above, in the light emission stage t5, a pulse width modulation (PWM) reset may be performed on the fourth node N4 (the first electrode of the light-emitting element, such as the anode). For example, when the pixel unit displays a low grayscale, the brightness is usually reduced by means of a high-frequency PWM; however, in the embodiment of the present disclosure, a PWM Anode refresh function can be added in case of low frequency, so that the low frequency Flicker can be greatly relieved. For example, as shown in FIG. 16 (the "No Anode Reset" corresponds to the case in which the PWM reset is not performed on the anode, and "Anode Reset" corresponds to the case in which the PWM reset is performed on the anode), the flicker under low grayscale and low frequency can be greatly relieved by increasing the frequency of Anode (anode) refresh, so that human eyes can obtain better viewing effect.

The technical effects of the driving method of the pixel circuit provided by the embodiments of the present disclosure can refer to the corresponding descriptions of the pixel circuit 10 in the above embodiments, and will not be repeated here.

Figure 17:
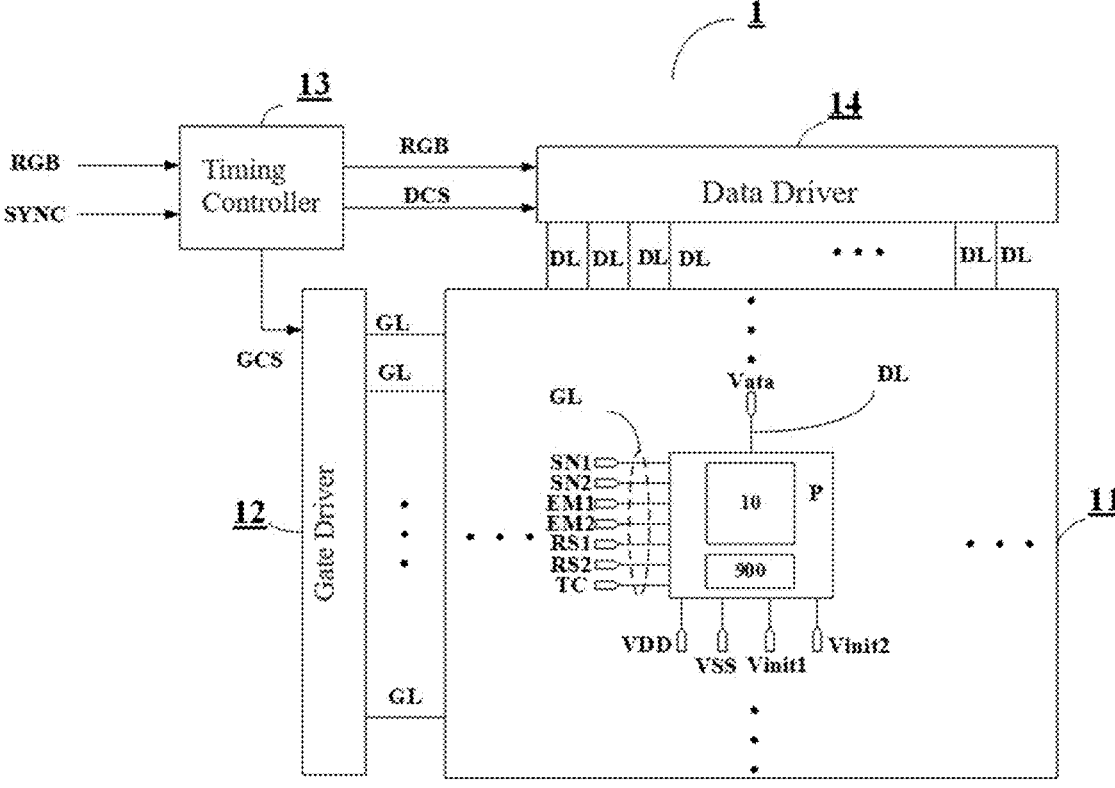
FIG. 17 is a schematic block diagram of a display panel provided by at least some embodiments of the present disclosure.

At least some embodiments of the present disclosure further provide a display panel including a plurality of pixel units arranged in an array, and each pixel unit includes a pixel circuit provided by any of the embodiments of the present disclosure. FIG. 17 is a schematic block diagram of a display panel provided by at least some embodiments of the present disclosure. As shown in FIG. 17, the display panel 11 is provided in a display device 1 and is electrically connected to a gate driver 12, a timing controller 13 and a data driver 14. The display panel 11 includes pixel units P defined by a plurality of gate lines GL intersecting with a plurality of data lines DL; the gate driver 12 is used for driving the plurality of gate lines GL; the data driver 14 is used for driving the plurality of data lines DL; the timing controller 13 is used for processing image data RGB input from the outside of the display device 1, supplying the data driver 14 with processed image data RGB, and outputting a scanning control signal GCS and a data control signal DCS to the gate driver 12 and the data driver 14 so as to control the gate driver 12 and the data driver 14.

For example, the display panel 11 includes a plurality of pixel units P arranged in an array, and the pixel unit P includes the pixel circuit 10 provided in any of the above embodiments and a light-emitting element 900. As shown in FIG. 17, the display panel 11 further includes a plurality of gate lines GL and a plurality of data lines DL. For example, the plurality of gate lines are correspondingly connected to the pixel circuits 10 of each row of pixel units to provide various control signals, such as the first scanning signal SN1, the second scanning signal SN2, the first light emission control signal EM1, the second light emission control signal EM2, the first reset control signal RS1, the second reset control signal RS2 and the transmission control signal TC. For example, in case that some of these control signals are the same signal, the same gate line can be used to be connected to the corresponding control signal terminals in each row of pixel units 10 to provide the same signal, so that the number of the gate lines can be reduced, the layout space of the display panel can be saved, and the development of a high-resolution display panel can be facilitated.

For example, as shown in FIG. 10, each pixel unit P may be connected to five gate lines GL (referring to the signal timing shown in FIGS. 12-15, two pairs of control signals among the first scanning signal SN1, the second scanning signal SN2, the first light emission control signal EM1, the second light emission control signal EM2, the first reset control signal RS1, the second reset control signal RS2 and the transmission control signal TC can share one and the same gate line, respectively), one data line DL, a first power supply voltage line for providing the first power supply voltage VDD, a second power supply voltage line for providing the second power supply voltage VSS, a first initialization voltage line for providing the first initialization voltage Vinit1 and a second initialization voltage line for providing the second initialization voltage Vinit2. For example, the first power supply voltage line or the second power supply voltage line may be replaced by a corresponding plate-like or mesh-like common electrode (such as a common anode or a common cathode). It should be noted that in FIG. 17, only part of the pixel units P, the gate lines GL and the data lines DL are shown.

For example, the data line DL corresponding to each column of pixel units is connected to the data writing circuit 200 in the pixel circuit 10 of this column of pixel units P to provide the data signal.

For example, some of these control signals can be reused for pixel units in different rows, thus simplifying the layout space around the display panel and facilitating the development of high-resolution display panels. For example, for one row of pixel units, the first light emission control signal EM1 used to control the first light emission control circuit 400 in the pixel circuit 10 of the pixel unit of the current row can also be used to control the second light emission control circuit 500 in the pixel circuit 10 of the pixel unit of a previous row, that is, reused as the second light emission control signal EM2 in the pixel circuit 10 of the pixel unit of the previous row; similarly, the second light emission control signal EM2 used to control the second light emission control circuit 500 in the pixel circuit 10 of the pixel unit of the current row can also be used to control the first light emission control circuit 400 in the pixel circuit 10 of the pixel unit of a next row, that is, reused as the first light emission control signal EM1 in the pixel circuit 10 of the pixel unit of the next row. It should be noted that the embodiments of the present disclosure include such case but are not limited thereto.

For example, the gate driver 12 supplies a plurality of gate lines GL with a plurality of control signals according to a plurality of scanning control signals GCS from the timing controller 13. The plurality of control signals include, for example, the first scanning signal SN1, the second scanning signal SN2, the first light emission control signal EM1, the second light emission control signal EM2, the first reset control signal RS1, the second reset control signal RS2 and the transmission control signal TC. These control signals are supplied to each of the pixel units P through the plurality of gate lines GL.

For example, the data driver 14 uses a reference gamma voltage to convert digital image data RGB input from the timing controller 13 into data signals according to a plurality of data control signals DCS from the timing controller 13. The data driver 14 supplies the converted data signals to the plurality of data lines DL. For example, the timing controller 13 processes the image data RGB input from the outside to be matched with the size and the resolution of the display panel 11, and then provides the processed image data to the data driver 14. The timing controller 13 generates a plurality of scanning control signals GCS and a plurality of data control signals DCS by using synchronization signals (such as dot clock DCLK, data enabling signal DE, horizontal synchronization signal Hsync and vertical synchronization signal Vsync) input from the outside of the display device. The timing controller 13 provides the scanning control signals GCS and the data control signals DCS as generated to the gate driver 12 and the data driver 14, respectively, for the control of the gate driver 12 and the data driver 14.

For example, the data driver 14 can be connected to a plurality of data lines DL to provide the data signal Vdata;

at the same time, the data driver 14 can also be connected to a plurality of first power supply voltage lines, a plurality of second power supply voltage lines, a plurality of first initialization voltage lines and a plurality of second initialization voltage lines to provide the first power supply voltage VDD, the second power supply voltage VSS, the first initialization voltage Vinit1 and the second initialization voltage Vinit2, respectively.

For example, the gate driver 12 and the data driver 14 may be implemented as semiconductor chips. For example, the gate driver 12 can also be implemented as a gate driver circuit and directly integrated on the display panel to form a GOA (Gate driver On Array). For example, the display device 1 may further include other components, such as a signal decoding circuit, a voltage conversion circuit, etc. Known conventional components may be adopted as these components, for example, and will not be described in detail here.

For example, the display panel 11 provided by this embodiment can realize line sequence scanning. It should be noted that in the line sequence scanning process, each of the control signals (the first scanning signal SN1, the second scanning signal SN2, the first light emission control signal EM1, the second light emission control signal EM2, the first reset control signal RS1, the second reset control signal RS2 and the transmission control signal TC) is applied line by line according to the signal timing; the driving process of each row of pixel units can refer to the relevant descriptions of the driving method of the pixel circuit described above, and will not be repeated here.

For example, the display panel 11 provided in this embodiment can be applied to any product or component with display function, such as electronic paper, mobile phone, tablet computer, TV set, displayer, notebook computer, digital photo frame, navigator, etc.

The technical effects of the display panel provided by the embodiments of the present disclosure can refer to the corresponding descriptions of the pixel circuit 10 in the above embodiments, and will not be repeated here.

The following statements should be noted:

(1) The accompanying drawings related to the embodiments of the present disclosure involve only the structures in connection with the embodiments of the present disclosure, and other structures can be referred to common designs.

(2) In case of no conflict, features in one embodiment or in different embodiments of the present disclosure can be combined.

The foregoing are only exemplary embodiments of the present disclosure and are not intended to limit the scope of protection of the present disclosure, and any variations or substitutions readily conceivable by any person skilled in the art within the scope of the technology disclosed herein shall be covered by the scope of protection of the present disclosure. Accordingly, the scope of protection of the present disclosure is determined by the appended claims.

The invention claimed is:

1. A pixel circuit, comprising: a driving circuit, a data writing circuit, a compensation control circuit, an energy storage circuit, a first light emission control circuit, a second light emission control circuit, a first initialization circuit, a second initialization circuit and a transmission circuit; wherein the driving circuit comprises a control terminal, a first terminal and a second terminal, and is configured to control a driving current flowing through the first terminal and the second terminal for driving a light-emitting element to emit light; the data writing circuit is configured to write a data signal into the first terminal of the driving circuit under a control of a first scanning signal; the compensation control circuit is configured to compensate for the driving circuit under a control of a second scanning signal; the energy storage circuit is configured to store a voltage of the control terminal of the driving circuit; the first light emission control circuit is configured to apply a first power supply voltage of a first power supply terminal to the first terminal of the driving circuit under a control of a first light emission control signal; the second light emission control circuit is configured to apply the driving current to a first electrode of the light-emitting element under a control of a second light emission control signal; the first initialization circuit is configured to apply a first initialization voltage to the control terminal of the driving circuit under a control of a first reset control signal; the transmission circuit is configured to transmit the first initialization voltage under a control of a transmission control signal; and the second initialization circuit is configured to apply a second initialization voltage to the first electrode of the light-emitting element under a control of a second reset control signal, wherein the first initialization circuit and the transmission circuit are jointly configured to apply the first initialization voltage to the control terminal of the driving circuit, and the compensation control circuit is further configured to transmit the first initialization voltage of the control terminal of the driving circuit to the second terminal of the driving circuit under a control of the second scanning signal, wherein the second initialization circuit comprises a seventh transistor, the seventh transistor is an N-type oxide thin film transistor, the second reset control signal and the first light emission control signal or the second light emission control signal are a same control signal; and the transmission control signal and the second light emission control signal or the first light emission control signal are a same control signal, the first initialization circuit comprises a first transistor, and the transmission circuit comprises an eighth transistor, the first transistor and the eighth transistor are P-type thin film transistors, and a value of a width-length ratio of a channel region of the first transistor is in a range of [1/3, 3/4], and a value of a width-length ratio of a channel region of the eighth transistor is in a range of [1/3, 3/4].

2. The pixel circuit according to claim 1, wherein the driving circuit comprises a third transistor;

a gate electrode of the third transistor serves as the control terminal of the driving circuit, a first electrode of the third transistor serves as the first terminal of the driving circuit, and a second electrode of the third transistor serves as the second terminal of the driving circuit.

3. The pixel circuit according to claim 2, wherein the data writing circuit comprises a fourth transistor;

a gate electrode of the fourth transistor is connected to a first scanning signal terminal to receive the first scanning signal, a first electrode of the fourth transistor is connected to a data signal terminal to receive the data signal, and a second electrode of the fourth transistor is connected to the first terminal of the driving circuit.

4. The pixel circuit according to claim 3, wherein the compensation control circuit comprises a second transistor, and the energy storage circuit comprises a storage capacitor;

a gate electrode of the second transistor is connected to a second scanning signal terminal to receive the second scanning signal, a first electrode of the second transistor is connected to the second terminal of the driving circuit, and a second electrode of the second transistor is connected to the control terminal of the driving circuit, a first electrode of the storage capacitor is coupled with the control terminal of the driving circuit, and a second electrode of the storage capacitor is coupled with the first power supply terminal.

5. The pixel circuit according to claim 4, wherein the second transistor is an N-type oxide thin film transistor, and the N-type oxide thin film transistor comprises a first metal layer, an active layer and a second metal layer which are sequentially stacked and insulated from each other, in an extension direction of the active layer, a width of the second metal layer is not greater than a width of the first metal layer;

the second metal layer and the second scanning signal terminal are connected so as to serve as the gate electrode of the second transistor, or, both of the second metal layer and the first metal layer are connected to the second scanning signal terminal to serve as the gate electrode of the second transistor at the same time;

the active layer comprises a channel region covered by the first metal layer, and a value of a width-length ratio of the channel region of the N-type oxide thin film transistor is in a range of [1/2, 7/8].

6. The pixel circuit according to claim 4, wherein the first light emission control circuit comprises a fifth transistor, a gate electrode of the fifth transistor is connected to a first light emission control signal terminal to receive the first light emission control signal, a first electrode of the fifth transistor is connected to the first power supply terminal to receive the first power supply voltage, and a second electrode of the fifth transistor is connected to the first terminal of the driving circuit.

7. The pixel circuit according to claim 6, wherein the second light emission control circuit comprises a sixth transistor, a gate electrode of the sixth transistor is connected to a second light emission control signal terminal to receive the second light emission control signal, a first electrode of the sixth transistor is connected to the second terminal of the driving circuit, and a second electrode of the sixth transistor is connected to the first electrode of the light-emitting element.

8. The pixel circuit according to claim 7, wherein a gate electrode of the seventh transistor is connected to a second reset control signal terminal to receive the second reset control signal, a first electrode of the seventh transistor is connected to a second initialization voltage terminal to receive the second initialization voltage, and a second electrode of the seventh transistor is connected to the first electrode of the light-emitting element.

9. The pixel circuit according to claim 8, wherein a gate electrode of the first transistor is connected to a first reset control signal terminal to receive the first reset control signal, a first electrode of the first transistor is connected to a first initialization voltage terminal to receive the first initialization voltage, and a second electrode of the first transistor is connected to a first electrode of the eighth transistor;

a gate electrode of the eighth transistor is connected to a transmission control signal terminal to receive the transmission control signal, and a second electrode of the eighth transistor is connected to the control terminal of the driving circuit.

10. The pixel circuit according to claim 9, wherein the second transistor is an N-type oxide thin film transistor; and the third transistor, the fourth transistor, the fifth transistor, and the sixth transistor are all P-type thin film transistors;

the second reset control signal and the first light emission control signal are a same control signal; and the transmission control signal and the second light emission control signal are a same control signal.

11. The pixel circuit according to claim 8, wherein a gate electrode of the first transistor is connected to a first reset control signal terminal to receive the first reset control signal, a first electrode of the first transistor is connected to the second electrode of the second transistor, and a second electrode of the first transistor is connected to the control terminal of the driving circuit;

a gate electrode of the eighth transistor is connected to a transmission control signal terminal to receive the transmission control signal, a first electrode of the eighth transistor is connected to a first initialization voltage terminal to receive the first initialization voltage, and a second electrode of the eighth transistor is connected to the first electrode of the first transistor;

the second electrode of the second transistor is connected to the control terminal of the driving circuit through the first transistor.

12. The pixel circuit according to claim 11, wherein the second transistor is an N-type oxide thin film transistor; and the third transistor, the fourth transistor, the fifth transistor, and the sixth transistor are all P-type thin film transistors;

the second reset control signal and the first light emission control signal are a same control signal; and the transmission control signal and the second light emission control signal are a same control signal.

13. The pixel circuit according to claim 8, wherein a gate electrode of the first transistor is connected to a first reset control signal terminal to receive the first reset control signal, a first electrode of the first transistor is connected to a first initialization voltage terminal to receive the first initialization voltage, and a second electrode of the first transistor is connected to a first electrode of the eighth transistor;

a gate electrode of the eighth transistor is connected to a transmission control signal terminal to receive the transmission control signal, and a second electrode of the eighth transistor is connected to the second terminal of the driving circuit.

14. The pixel circuit according to claim 13, wherein the second transistor is an N-type oxide thin film transistor; and the third transistor, the fourth transistor, the fifth transistor, and the sixth transistor are all P-type thin film transistors;

the second reset control signal and the second light emission control signal are a same control signal; and the transmission control signal and the first light emission control signal are a same control signal.

15. A display panel, comprising a plurality of pixel units arranged in an array; wherein each of the plurality of pixel units comprises the pixel circuit according to claim 1.

16. A driving method of the pixel circuit according to claim 1, comprising a reset stage, a data writing and compensation stage, a holding stage, and a light emission stage; wherein, in the reset stage, inputting the second scanning signal, the first reset control signal, the second reset control signal and the transmission control signal; turning on the compensation control circuit, the first initialization circuit, the second initialization circuit and the transmission circuit; applying the first initialization voltage to the control terminal of the driving circuit through the first initialization circuit and the transmission circuit to reset the control terminal of the driving circuit; applying the first initialization voltage to the second terminal of the driving circuit through the first initialization circuit, the transmission circuit and the compensation control circuit to reset the second terminal of the driving circuit; and applying the second initialization voltage to the first electrode of the light-emitting element through the second initialization circuit to reset the light-emitting element, the first initialization circuit comprises a first transistor, and the transmission circuit comprises an eighth transistor, the first transistor and the eighth transistor are P-type thin film transistors, and a value of a width-length ratio of a channel region of the first transistor is in a range of [1/3, 3/4], and a value of a width-length ratio of a channel region of the eighth transistor is in a range of [1/3, 3/4].

17. The driving method according to claim 16, wherein in the data writing and compensation stage, inputting the first scanning signal and the second scanning signal; turning on the data writing circuit, the driving circuit and the compensation control circuit; writing the data signal into the compensation control circuit through the data writing circuit; and compensating for the driving circuit through the compensation control circuit;

in the holding stage, inputting the second scanning signal; turning off the compensation control circuit; and holding a voltage of the control terminal of the driving circuit through the energy storage circuit;

in the light emission stage, inputting the first light emission control signal and the second light emission control signal; turning on the first light emission control circuit, the second light emission control circuit and the driving circuit; applying the first power supply voltage to the first terminal of the driving circuit through the first light emission control circuit, so that the driving circuit generates a driving current according to a voltage at the control terminal of the driving circuit; and applying the driving current to the light-emitting element through the second light emission control circuit, so that the light-emitting element emits light.

*    *    *    *    *